United States Patent
Ikeda et al.

(10) Patent No.: US 7,577,821 B2
(45) Date of Patent: *Aug. 18, 2009

(54) IC CONTAINING MATRICES OF PLURAL TYPE OPERATION UNITS WITH CONFIGURABLE ROUTING WIRING GROUP AND PLURAL DELAY OPERATION UNITS BRIDGING TWO WIRING GROUPS

(75) Inventors: Kenji Ikeda, Tokyo (JP); Hiroshi Shimura, Tokyo (JP); Tomoyoshi Sato, Ibaraki (JP)

(73) Assignee: IPFlex Inc., Tokyo (JP)

(*) Notice: Subject to any disclaimer, the term of this patent is extended or adjusted under 35 U.S.C. 154(b) by 27 days.

This patent is subject to a terminal disclaimer.

(21) Appl. No.: 11/670,302

(22) Filed: Feb. 1, 2007

(65) Prior Publication Data

US 2007/0186078 A1    Aug. 9, 2007

Related U.S. Application Data

(62) Division of application No. 10/333,534, filed as application No. PCT/JP02/05047 on May 24, 2002, now Pat. No. 7,191,312.

(30) Foreign Application Priority Data

May 24, 2001    (JP)    ............................. 2001-155759

(51) Int. Cl.
    *G06F 15/80*    (2006.01)
(52) U.S. Cl. .......................................... 712/16; 712/15
(58) Field of Classification Search ........................ None
    See application file for complete search history.

(56) References Cited

U.S. PATENT DOCUMENTS 4,967,340 A * 10/1990 Dawes .......................... 712/19
5,426,378 A    6/1995 Ong
5,450,557 A    9/1995 Kopp et al.
5,457,644 A    10/1995 McCollum
5,596,743 A    1/1997 Bhat et al.

(Continued)

FOREIGN PATENT DOCUMENTS

EP    668659    8/1995

(Continued)

OTHER PUBLICATIONS

Supplementary European search report for PCT/JP02/05047 dated Sep. 21, 2007.

(Continued)

*Primary Examiner*—Kenneth S Kim
(74) *Attorney, Agent, or Firm*—Marshall, Gerstein & Borun LLP

(57) ABSTRACT

An integrated circuit device comprising a data processing block including a first matrix and a second matrix is disclosed. The first matrix and the second matrix respectively include a plurality of types of operation units and a wiring group for connecting the plurality of types of operation units, a configuration of data flow with the plurality of types of operation units being changeable by changing a route of the wiring group for data supplying to the plurality of types of operation units. One of the plurality of types of operation units is a delay type operation unit that include a data path suited to processing for delaying a transfer time of data. The wiring group of the first matrix and the wiring group of the second matrix are separated, and the integrated circuit device further comprises a plurality of the delay type operation units that are arranged along boundary of the first matrix and the second matrix for connecting the wiring group of the first matrix and the wiring group of the second matrix via data paths included in the plurality of the delay type operation units.

16 Claims, 16 Drawing Sheets

U.S. PATENT DOCUMENTS

| | | |
|---|---|---|
| 5,692,147 A | 11/1997 | Larsen et al. |
| 5,966,534 A | 10/1999 | Cooke et al. |
| 6,122,719 A * | 9/2000 | Mirsky et al. ............ 712/15 |
| 6,180,824 B1 | 1/2001 | Nakaya |
| 2002/0019925 A1 | 2/2002 | Dewhurst et al. |
| 2003/0088757 A1* | 5/2003 | Lindner et al. ............ 712/37 |

FOREIGN PATENT DOCUMENTS

| | | |
|---|---|---|
| JP | 07086921 | 3/1995 |
| JP | 08051356 | 2/1996 |
| JP | 08101761 | 4/1996 |
| JP | 09246954 | 9/1997 |
| JP | 11120210 | 4/1999 |
| JP | 11353152 | 12/1999 |
| JP | 2000512097 | 9/2000 |
| JP | 2002508102 | 3/2002 |
| WO | WO-9900731 | 1/1999 |

OTHER PUBLICATIONS

Cronquist et al., "Architecture Design of Reconfiguurable Pipelined Datapaths," *Advanced Research in VLSI*, pp. 23-40 (1999).

International Search Report in PCT/JP02/05047 dated Sep. 10, 2002.

* cited by examiner

```
sync int32 a, b, c, d;
a @= input [0];
b @= input [1];
c @= a + b;
d @= c + b;
output [0] = d;
```
73b

IC CONTAINING MATRICES OF PLURAL TYPE OPERATION UNITS WITH CONFIGURABLE ROUTING WIRING GROUP AND PLURAL DELAY OPERATION UNITS BRIDGING TWO WIRING GROUPS

TECHNICAL FIELD

The present invention relates to an integrated circuit device in which a plurality of operation units are arranged in a matrix.

RELATED ART

FPGA (Field Programmable Gate Arrays) are conventionally known as integrated circuit devices in which logic gates are laid out in arrays and the interconnects between the logic gates can be freely changed. The construction of an FPGA can be roughly classified into a plurality of logic blocks and wiring that connects these logic blocks. A logic block is a circuit unit that includes a lookup table and a flip-flop, and, by changing the set values in the lookup table, functions as a logic gate for achieving a logic function, such as an AND or an OR, in bit units. A plurality of logic blocks are arranged in an array or in a matrix and are connected by row wires and column wires. Row wires and column wires are connected by switch matrices or the like at the intersections between the wires so that the wiring can be reconfigured. By reconfiguring the wiring, the configuration of the logic blocks can be changed.

FPGAs are produced as an architecture where the connections can be changed at the transistor level, and are integrated circuit devices where a certain degree of the executable functions can be changed even after the FPGAs have been manufactured. Accordingly, an FPGA is an architecture where a variety of dedicated computational circuits can be realized by the same hardware and some limited degree of dynamic control over the functioning might be realized. To provide an architecture that can be applied to wide range of uses, the logic blocks that compose an FPGA have the same construction, and the logic function that can be realized by each logic block is limited to around the AND, OR, or NAND level. The data to be processed is handled in bit units, so that each of the logic blocks is provided with only a lookup table composed of an SRAM for 4 bits or so.

FPGAs realize the functions of logic gates, such as an AND gate and an OR gate, using logic blocks that include lookup tables, and by connecting such logic blocks using a reconfigurable set of wires, realize the functions of a variety of dedicated computational circuits. Accordingly, the area efficiency is low relative to the functions that can be realized, and the computation speed is also not particularly high. When the functions to be realized by an FPGA are changed, the functions of an extremely large number of logic blocks have to be changed, so that it is hard to make dynamic changes. Even if it is possible to reduce the time required to change the functions by providing special hardware for directly controlling each logic block separately, it is still difficult to dynamically control such special hardware during the execution of an application and this solution is not economic.

The inventors of the present invention propose an integrated circuit device, including a plurality of types of operation units that are equipped with data paths (hardware logic or circuits) that are suited to required or special-purpose processing, where it is possible to define the functioning of the integrated circuit device as a desired special-purpose processing unit by changing the connections between the operation units. With this integrated circuit device, there is no need to change all of the connections at the transistor level as is the case with an FPGA, so that the hardware can be reconfigured in a short time. Since the architecture does not need to have general-purpose applicability at the transistor level like an FPGA, the packing density can be improved, and a compact, economical system can be produced. Redundant components can also be eliminated, so that the processing speed is increased and the AC characteristics are improved.

However, since an FPGA is composed of a plurality of similar function units or function blocks, the layout process of arranging such function blocks in a matrix and positioning row wires and column wires between them has a high degree of regularity, which makes it easy to design an FPGA and leads to high area efficiency on an element level. On the other hand, operation units including data paths that are suited to special-purpose processing have data paths that differ according to the special-purpose processing to be performed, so that the operation units do not all have the same circuit construction. This means that the area required to produce an operation unit on a silicon substrate is not equal for all operation units. In order to produce a matrix in the same way as an FPGA composed of a single type of function block, it is possible to arrange the various kinds of operation units so that each operation unit occupies the same area regardless of the data path included in the operation unit. In other words, it is possible to lay out a plurality of operation units in a matrix in which each operation unit is given an area equal to the area occupied by the operation unit that requires the largest area. However, this lowers the area efficiency, which results in an integrated circuit being extremely large, and also causes a deterioration of the AC characteristics. This makes it impossible to fully achieve the basic merits of an integrated circuit device composed of operation units with data paths that are suited to special-purpose processing.

In view of the above, it is an object of the present invention to design an actual integrated circuit device that includes various types of operation units with data paths that are suited to special-purpose processing and provide an integrated circuit device that can make use of the benefits of such operation units. It is a further object of the present invention to provide a compact, economical integrated circuit device that has a high processing speed and favorable AC characteristics.

DISCLOSURE OF THE INVENTION

The integrated circuit device of the present invention comprises a data processing block including a plurality of operation units arranged in a first and second direction in a matrix, a plurality of first wire sets that extend in the first direction corresponding to the arrangement of the plurality of operation units in the first direction and transfer input data and/or output data of each of the operation units, a plurality of second wire sets that extend in the second direction corresponding to the arrangement of the plurality of operation units in the second direction and transfer input data and/or output data of each of the operation units, and a plurality of switching units that are positioned at each intersection between the first and second wire sets and are capable of selecting and connecting any wire included in the first wire sets to any wire included in the second wire sets. In this integrated circuit device, the plurality of operation units include a plurality of types of operation units with different data paths that are suited to special-purpose processing, or are sorted into the plurality of types of operation units, with operation units of the same type forming an arrangement in the first or second direction.

In the present specification, the expression "operation units" refers to small-scale units that (1) process data in byte or word unit, (2) are equipped with data paths which are suited to special-purpose or specific processing, and (3) can execute a special-purpose or specific arithmetic operation, a special-purpose or specific logic operation, or a combination of such. These operation units are also referred to as elements, logic elements, logic units or circuit units. The area required to produce a plurality of types of operation units that include different or unique data paths that are suited to special-purpose processing on a semiconductor substrate is likely to differ for each type of operation units. However, for operation units of the same type, the occupied area is the same. Accordingly, by having operation units of the same type form an arrangement in a first direction or in a second direction, fluctuations due to differences in the sizes of operation units is eliminated. If the first direction is a row direction (the horizontal direction, lateral or width direction), the second direction is the column direction (the vertical direction, longitudinal or height direction). As one example, if operation units of the same type form an arrangement in the first direction, the plurality of operation units can be arranged so as to form a straight band with an even width. Accordingly, a plurality of operation units, for which the data path differs according to the type and whose sizes are likely to be different, can be arranged in a straight line in the first direction without generating redundant space in the second direction. Since the operation units are aligned in the first direction in a straight line without size fluctuations, it is possible to lay out at least the wire sets in the first direction in a straight line. This makes it possible to increase the area efficiency and the integration of an integrated circuit device in which operation units including different data paths are arranged in a matrix, so that an economical integrated circuit device that has a high processing speed and favorable AC characteristics can be provided.

When large numbers of the same types of operation units are arranged, the operation units can be arranged so that a plurality of lines are formed in the first or second direction. When the number of one type of operation unit, for example, a first type of operation unit, is much higher than the number of a second type of operation unit, if the first type of operation units are positioned simply in accordance with the length of the arrangements of the second type of operation units, the overall shape of the data processing block ends up being too long and thin, which may reduce the area efficiency. In this case, it is preferable to improve the shape of the data processing block by linking arrangements of the first type of operation units to the arrangements of the second type of operation units. In this case, in at least part of the data processing block, which is to say, a range that is as wide as the arrangements of the second type of operation units, arrangements of operation units of the same type are formed in the first or second direction.

When operation units of the same type are arranged in the first direction, even operation units whose sizes differ according to the types of the operation units can be aligned in a straight or linear line without fluctuations, though there is no guarantee that the operation units are arranged in a straight line in the second direction. Accordingly, it is preferable for the plurality of types of operation units to be positioned at equal intervals in the first direction so as to guarantee that the operation units are arranged in a straight line in the second direction. When this is the case, the wire sets in the second direction can be laid out in a straight line, so that the length of the wires that connect the operation units can be minimized. In addition, it becomes possible to position both of the first wire sets and the second wire sets in a straight line, so that it becomes easy to design an integrated circuit device in which operation units with different data paths are positioned in a matrix. When the sizes of the various types of operation units in the first direction are different, the most efficient arrangement in the second direction cannot be achieved. However, by designing the each type of operation units so that the differences in the area that is required by the various types of operation unit are equal in the second direction and absorbing such differences in the first direction, the various kinds of operation units can be efficiently positioned with the highest possible density in the first and second directions.

The first and second wire sets should preferably include carry wires for transferring carry signals, in addition to the bus wires that compose data buses for transferring data. With this construction, carry signals and signals showing true or false can be transferred from operation unit to operation unit via the same route as the data buses.

Operation units may input data from either of the first wire sets and the second wire sets and may output data to either of the wire sets. However, by setting a rule whereby data is inputted from one wire set and data is outputted to the other wire set, data can always be transferred from one operation unit to another operation unit via only one switching unit. Accordingly, it is preferable for the operation units to include means for inputting a signal from any wire included in the second wire sets and means for outputting a signal to any wire included in the first wire sets.

Each operation unit includes data paths that is suited to special-purpose processing, so that each operation unit can has suitable data paths for processing, such as an arithmetic operation, a logic operation, etc., even the operation requires a plurality of pieces of input data. It is preferable for the second wire sets will form the input wires and include a pair of wire sets that extend on both sides of the arrangements of operation units in the second direction, with such wiring making it easy for a plurality of pieces of input data to be obtained by operation units.

When the number of operation units included in a matrix increases, if these operation units are connected in a flexible manner, the required amount of wiring corresponds to the operation units, so that an extremely large amount of wiring becomes necessary. For this reason, it is preferable for the matrix to be divided into a plurality of matrices, for operation units that are suited to processing that delays the transfer of data to be arranged at the boundary between the first and second matrices that are in adjacent positions, for the first and second wire sets to be separated between the first and the second matrices, and for only the signals that are transmitted between the first and second matrices to use wiring of both the first and second matrices.

It is also preferable that the operation units with data paths suited to special-purpose processing include a number of types of operation units that include data paths suited to at least one different processing for instruction or instruction level. In the present specification, unless stated otherwise, the expression "instruction" refers to any instruction that forms part of an instruction set for writing a program, and includes compound instructions, macroinstructions, function calls, etc. Accordingly, each operation unit processes data in byte unit of 8 bits, or in word unit of 16, 32, or 64 bits. If the processing executed in this integrated circuit device can be described in a programming language of instructions that are supported by the operation units, by interchanging the program into the place-and-route of the operation units, an integrated circuit device for executing this processing can be easily designed and manufactured.

In other words, the present invention provides an integrated circuit device comprising a data processing block that includes a plurality of types of operation units that are arranged in a first and a second direction in a matrix and a wiring group that connects the plurality of types of operation units, the plurality of types of operation units including different types of operation units with data paths that are suited to execution of at least one different instruction. When designing this integrated circuit device, at least part of the processing executed in the integrated circuit device is converted into an intermediate description written in a programming language including instructions that are supplied by or can be executed by one or more of the plurality of types of operation units. Next, an execution configuration of a plurality of types of operation unit that can execute this intermediate description is generated and a data processing block, in which the plurality of types of operation units are arranged so as to achieve the execution configuration, is generated. By doing so, an integrated circuit device that can execute the provided processing can be designed and manufactured easily and in a short time. The integrated circuit device provided by this designing and manufacturing method executes the provided processing in hardware, and so has a high processing speed.

As the operation units that include data paths suited to processing at the instruction level, following type of operation units are available but not limited. A first type of operation unit includes a data path suited to input processing of data. A second type of operation unit includes a data path suited to processing that indicates an address of input data. A third type of operation unit includes a data path suited to output processing of data. A fourth type of operation unit includes a data path suited to processing that indicates an address of data to be outputted. A fifth type of operation unit includes a data path suited to arithmetic operations, such as adding or subtracting integers, and/or logic operations such as comparisons and selections. Multiplications may also be included in the fifth type of operation unit, though if this results in the fifth type of operation unit becoming too big, it is effective to separately provide a sixth type of operation unit including a data path suited to multiplication processing. By using these types of operation unit, it is possible to execute instructions that describe or define search processing or calculation processing that consumes a large amount of time as part of a large number of processes. For processing that is repeatedly executed with a high frequency, such as signal processes or loop processes, for example, can be performed at high speed using or distributed into a large number of hardware resources.

In other words, with the present invention, processing that the execution speed cannot be improved with a conventional software method where a low number of hardware resources are repeatedly used, can be executed by providing or distributing a large number hardware resources and performing simultaneous execution, and improved performance becomes possible.

To position the operation units for forming a smooth data flow in the data processing block, operation units with data paths suited to the processing of data input instructions and/or data output instructions should preferably be arranged at two ends of the data processing block. In order to perform pipeline-like processing, it is necessary to establish the number of clocks that are consumed by each operation unit. For this reason, it is preferable for each operation unit to be provided with an input flip-flop for latching the input data and an output flip-flop for latching the output data. However, a data path that is suited to processing input instructions or output instructions can itself be a flip-flop that latches data in byte or word unit, and in this case the input data and output data are latched by a single flip-flop.

When the internal data paths are different, the number of clocks consumed by each operation unit also differs. When the path taken in the data processing block differs, the timing at which data reaches an operation unit also differs. For this reason, it is preferable to provide a seventh type of operation unit that includes a data path which is suited to processing that delays the transfer time of data. When generating a configuration of operation units, an execution configuration that includes this type of operation unit for adjusting the timing is generated.

In order to increase the range of processing that can be executed by the operation units, it is effective to use an eighth type of operation unit that includes a data path suited to processing that connects to a computational circuit positioned on the outside of the data processing block. It is also effective to use a ninth type of operation unit including a data path whose processing can be selected according to a lookup table. In addition, by arranging operation units of the same type in the same direction, a plurality of operation units of the same type may be linked to provide an expanded computational function. To do so, it is preferable that the operation units of the same type that are arranged in the same direction include a path for linking the plurality of operation units of the same type that are arranged in the same direction and providing an expanded computational function. As one example, in the case of operation units that are suited to processing for arithmetical operations, computational processing with increased accuracy can be performed by arranging operation units with lower accuracy in the same direction.

By providing a plurality of data processing blocks and a third wire set for connecting these data processing blocks, the range of processing that can be handled by a configuration of operation units can be greatly expanded.

With the integrated circuit device of the present invention, the route taken by data supplied to operation units can be changed by controlling switching units that can select and connect any wire in the first wire sets to any wire in the second wire sets, so that the configuration of operation units for data processing can be changed. Accordingly, the present invention provides an integrated circuit device that comprises a data processing block in which a plurality of types of operation units are positioned and the configuration of the plurality of types of operation units for data processing is changed by changing the route taken by data that is supplied to the plurality of types of operation units by a wiring group, the plurality of types of operation units including different types of operation units that include data paths which are suited to at least one different processing on instruction level. With this integrated circuit device, the functioning of the data processing block and the processing content that is executed can be changed after the integrated circuit device has been manufactured. Unlike an FPGA that is intended to map a circuit at the transistor level, the configuration of operation units with data paths that are suited in advance to special-purpose processing can be changed, so that the processing content can be changed in a short time. Therefore, it is possible to provide an integrated circuit device where the content of the processing performed by hardware can be dynamically changed.

Although the data processing block of this integrated circuit device has an overall general applicability whereby different processing can be performed, each of the operation units is a special-purpose circuit unit with a data path that is suited in advance to special-purpose or specific processing, making the applicability of each operation unit low. This reduces the amount of redundancy in a view of circuit, so that useless circuit will be hardly left for processing that causes for providing a compact, economical integrated circuit device with a high processing speed.

In order to increase the flexibility of the configuration of operation units, it is preferable for the operation units to include means for selecting any wire out of the first wire sets and the second wire sets and inputting or outputting a signal. It is also preferable for the operation units to include a rewritable configuration memory for storing a selection of wires, and also for the switching units to include a rewritable configuration memory for storing a selection of wires. By rewriting the content configuration memories such as registers, the functioning of the data processing block can be dynamically changed. By storing the content to be changed in the memory in advance, the functioning composed by a wide range of operation units can be easily changed in one clock.

By installing a control unit for rewriting the contents of the configuration memories on the integrated circuit device, it is possible to provide an integrated circuit device in which the content of processing that is executed by hardware can be changed by a program. The control unit may be a small-scale component such as a sequencer or a microcode memory. However, it is preferable for the control unit to be a processing unit that has sufficient functions for changing the configuration of operation units according to a program. By combining a data processing block in which operation units (logic elements or logic units) are arranged in a matrix and a general-purpose processor such as a RISC processor, a device is provided in which processing that is suited a conventional software method where limited hardware resources are repeatedly used can be executed by the general-purpose processor and processing whose executed speed cannot be raised can be executed by the data processing block. It is also possible of the processing of the general-purpose processor and the processing of the data processing block to be executed in parallel. Furthermore, it is possible for an operation unit that composes the data processing block to set the configuration memory of another operation unit.

For the integrated circuit device that can be controlled by a program, an execution program of the integrated circuit device can be generated by (i) intermediate description for the process to be executed in a programming language that includes instructions which are supported by the operation units and (ii) including instructions that indicate the execution configuration of the plurality of types of operation units that can execute this intermediate description. It is preferable for the intermediate language to be an assembler-like language with high linearity so that data flowgrams are easy to produce.

The range of functions and processing that can be executed by hardware in the data processing block can be expanded by providing operation units that include means for changing and/or selecting part of the internal data paths of the operation units. The changes to and/or selection of the internal data path can be stored in the configuration memories of the operation units. The internal data paths of the operation units suited to processing at an instruction level are data paths that are suited to the execution of at least one instruction. The process of designing the integrated circuit device and generating an execution program generates an execution configuration that includes selections and/or changes of the internal data paths, and an execution program that includes an instruction indicating the selections and/or changes of the internal data paths.

BEST MODE FOR CARRYING OUT THE PRESENT INVENTION

Figure 1:
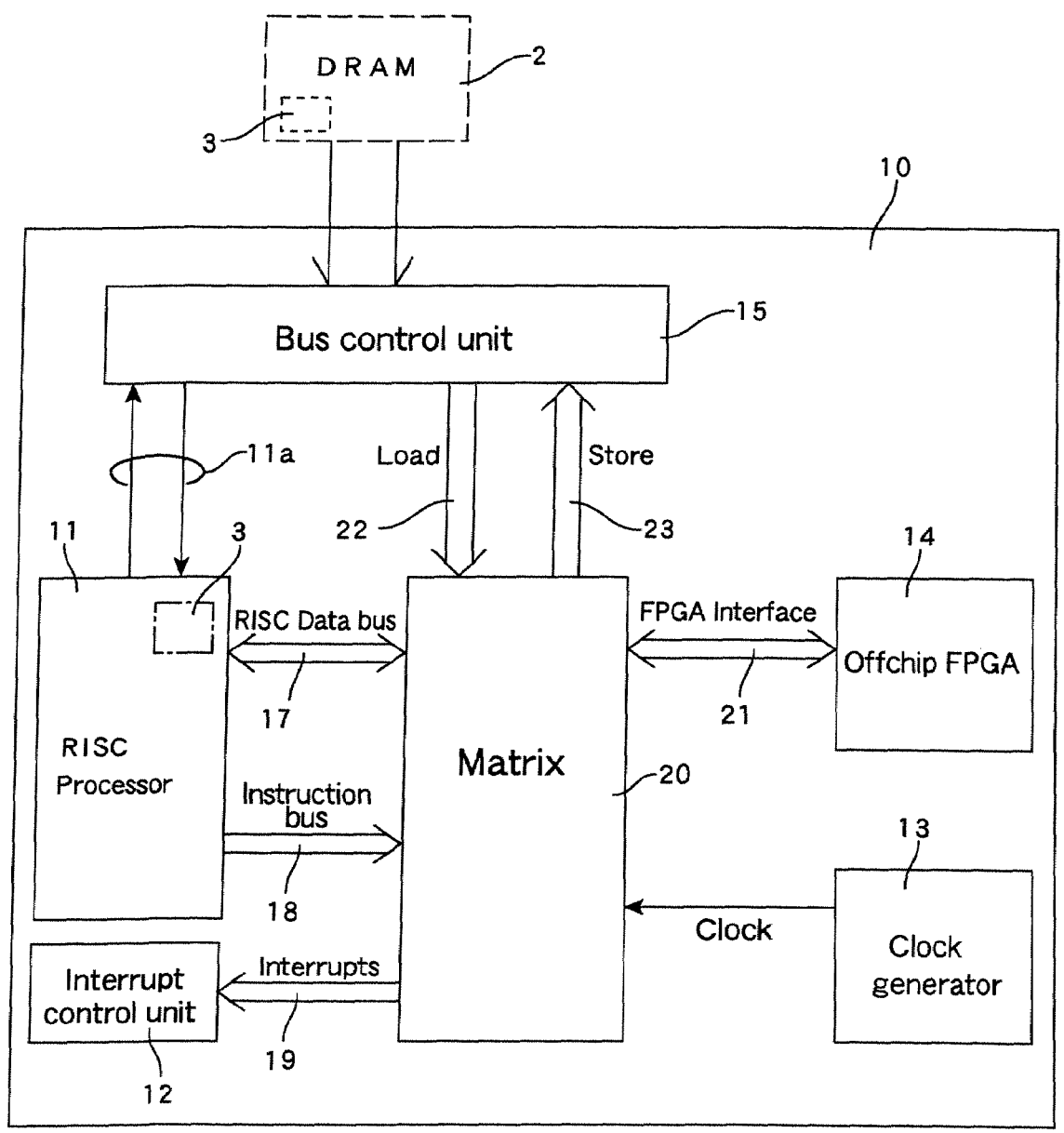
FIG. 1 is a block diagram showing the construction of an integrated circuit device according to an embodiment of the present invention.

The following describes the present invention with reference to the attached drawings. FIG. 1 shows an example where a system LSI 10 is configured as an integrated circuit device according to the present invention. This system LSI 10 includes a general-purpose processor 11, such as a RISC processor for performing general-purpose processing, includes error handling, based on instructions in an execution program 3, and a data processing block (hereafter referred to as the "matrix unit" or "matrix") 20 where a data flow or a pseudo data flow that is suited to special-purpose data processing is formed by a plurality of operation units that are arranged in a matrix. The general-purpose processor (hereafter also referred to as the "RISC") 11 also controls the configuration of the matrix 20 based on the execution program 3, so that the configuration of the matrix 20 can be dynamically changed. The system LSI 10 also includes an interrupt control unit 12 for controlling the handling of interrupts from the matrix 20, a clock generator 13 for supplying an operation clock signal to the matrix 20, an FPGA unit 14 that enables computational circuit to be constructed more flexibly, and a bus control unit 15 for controlling inputs and outputs of data to and from the external. The processor unit 11 and the matrix 20 are connected by a data bus 17, on which data can be exchanged between the processor 11 and the matrix 20, and an instruction bus 18 for allowing the processor 11 to control the configuration and operation of the matrix 20. Interrupt signals are also supplied from the matrix 20 via a signal line 19 to the interrupt control unit 12, so that when the processing by the matrix 20 has ended, when an error has occurred during the processing, etc., the state of the matrix 20 can be fed back to the processor 11.

The matrix 20 and the FPGA 14 are connected by a data bus 21. Data is supplied from the matrix 20 to the FPGA 14, processing is performed, and the result is returned to the matrix 20. The matrix 20 is connected to the bus control unit 15 by a load bus 22 and a store bus 23, and exchanges data with an external data bus of the system LSI 10. Accordingly, data can be inputted into the matrix 20 from an external DRAM 2 or another external device, and the result of such data being processed by the matrix 20 can be outputted back to the external device. The processor 11 is also capable of inputting and outputting data to and from an external device via a combination of a data bus 11a and the bus control unit 15. If the processor 11 is constructed with an internal code RAM or ROM, the execution program (object program) 3 of the processor 11 can be stored in advance in the processor 11. The execution program 3 can also be supplied from outside the LSI 10 via the bus 11a.

Figure 2:
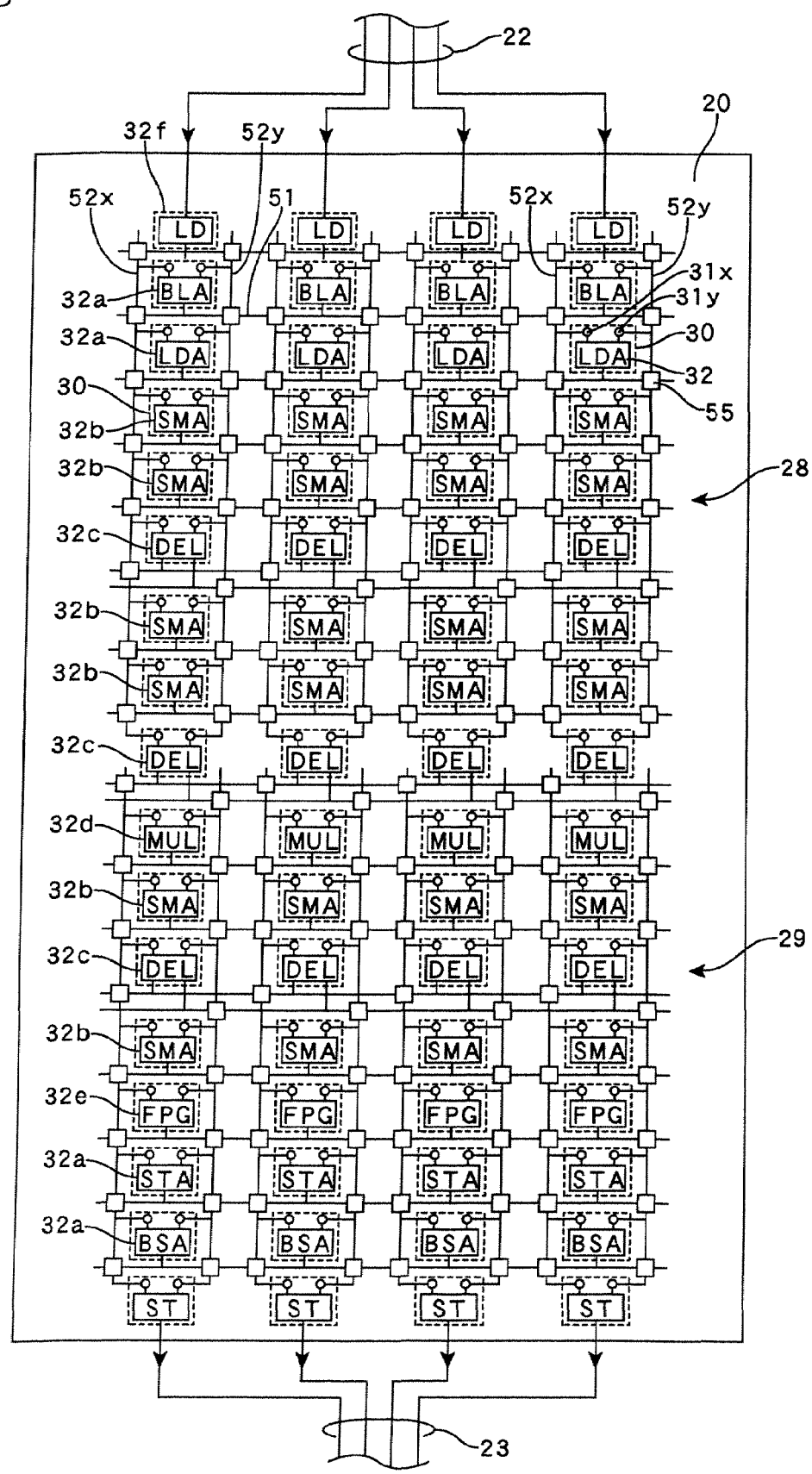
FIG. 2 shows the construction of the matrix.

FIG. 2 shows the construction of the matrix 20. The matrix 20 is composed of 68 operation units (operation elements) 30 that are arranged in 17 lines that extend in the horizontal or lateral direction (the row direction) and in 4 lines that extend in the vertical or longitudinal direction (the column direction), so that a plurality of operation units 30 are arranged in an array or matrix. Sets of row wires 51 that extend in the horizontal direction and sets of column wires 52 that extend in the vertical direction are disposed between these operation units 30. The column wire sets 52 includes a pair of wire sets 52x and 52y that are composed of the wires in the column direction on the left and right sides, respectively, of the operation units 30. Data are supplied to each of the operation units 30 via these wire sets 52x and 52y. The column wire sets 52 are divided at the operation units (DEL units) on the ninth row from the top, and the matrix 20 is divided into two segments composed of a first matrix 28 including the eight rows and four columns of operation units 30 at the top and a second matrix 29 including the nine rows and four columns of operation units 30 at the bottom.

Figure 3:
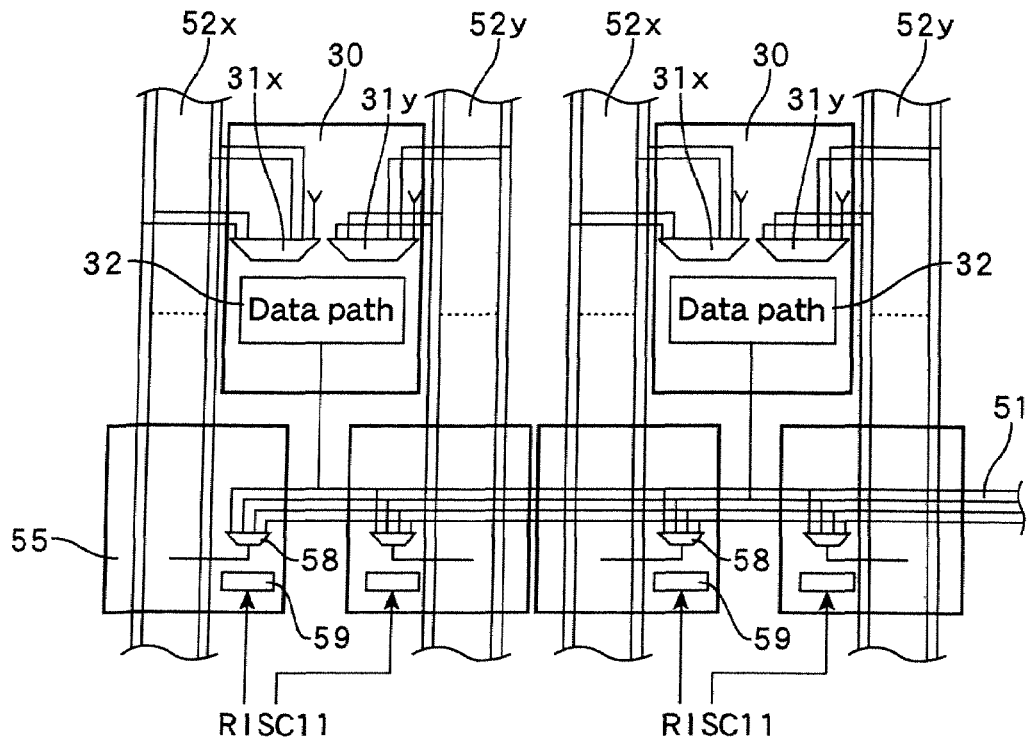
FIG. 3 shows an enlargement of part of the matrix shown in FIG. 2.

FIG. 3 shows an enlargement of an operation unit 30 and a switching unit 55 that is disposed at an intersection between the row wire set 51 and the column wire set 52. The row wire set 51 includes sufficient wiring to transfer byte (8-bit) data or word (16-bit or 32-bit) data, which is to say, 8 to 32 bits of data from each operation unit 30 that is arranged in the row direction (in this case 4 operation units 30). In the matrix 20 of the present embodiment, the row wire set 51 is a bus with sufficient wiring for at least four channels. Wires for transferring a sufficient number of carry signals corresponding to the amount of data are also provided.

The column wire sets 52 also include sufficient wiring for supplying each operation unit 30 with data in byte or word unit. In one segment in the matrix 20, eight operation units 30 are arranged in a column line, so that the column wire sets 52 in the present embodiment are buses with sufficient wiring for eight channels. Wires for transferring a sufficient number of carry signals corresponding to the amount of data are also provided.

Figure 4:
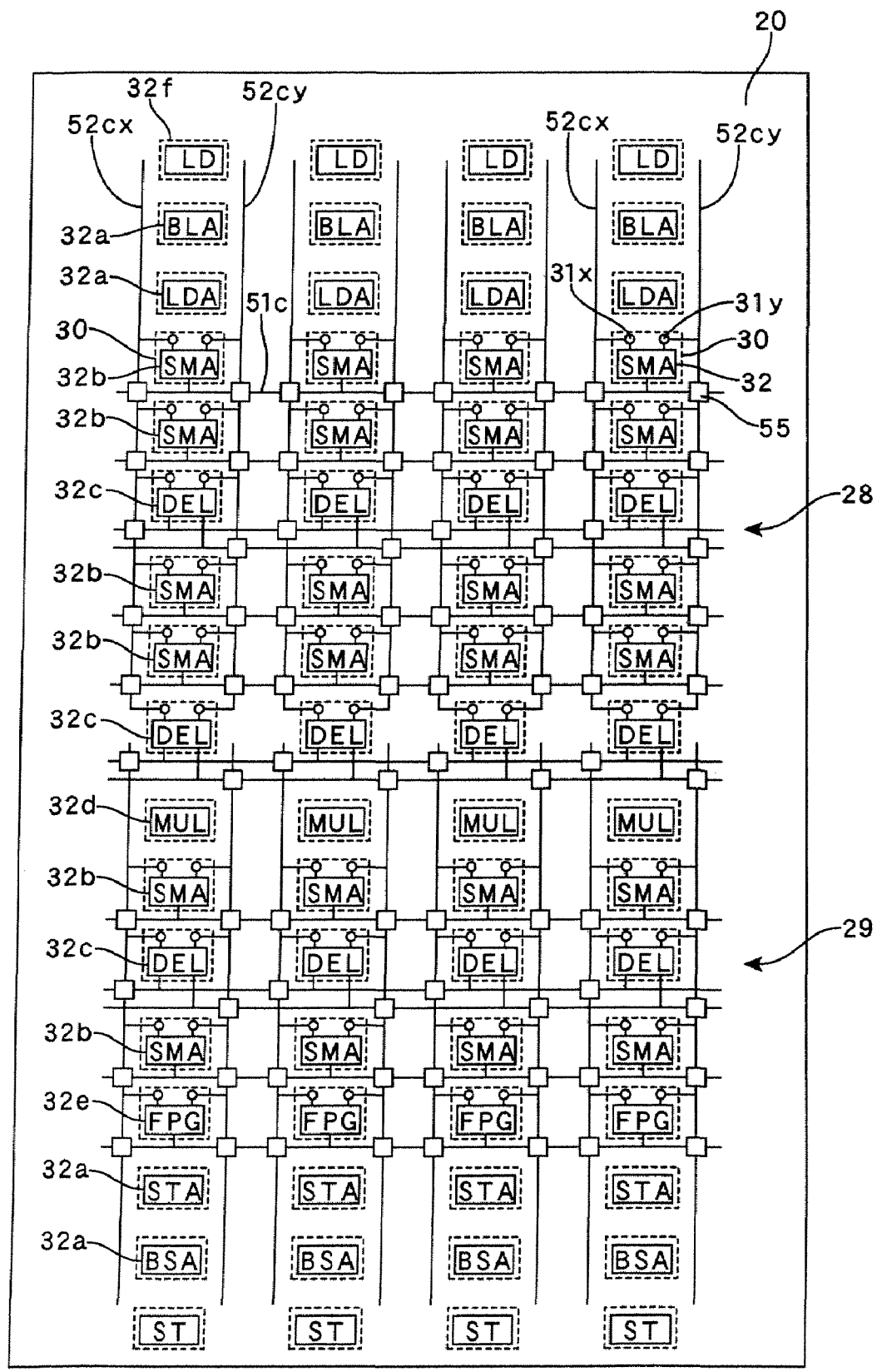
FIG. 4 shows the arrangement of the wires that transmit carry signals, out of the wire sets in the matrix shown in FIG. 2.

FIG. 4 shows wires 51c, 52cx, and 52cy provided for transferring carry signals, out of the row wire sets 51 and the column wire sets 52 of the matrix 20 in the present embodiment. The carry signals can be used as signals that show a carry or signals that show true-false, and in the matrix 20, the carry signal Ci is used by data path units (SMA) 32b that are suited to arithmetic operations and logic operations, data path units (DEL) 32c for delaying, and data path units (FPG) that are interfaces with the FPGA, among the operation units 30. Accordingly, the wires 51c, 52cx and 52y for carry signals are disposed so as to connect the operation units 30 that include these data path units.

The switching units 55 that are arranged at each intersection between the row wire sets 51 and the column wire sets 52, are constructed of a reconfigurable transfer path for data in byte or word unit and switch and connects any of the channels of the row wire set 51 to any of the channels of a column wire set 52. The switching unit 55 shown in FIG. 3 includes a plurality of selectors 58 for selecting one channel of the row wire set 51 and connecting the channel to the column wire set 52, and a configuration RAM 59 for storing the settings of these selectors 58. The data in the configuration RAM 59 is rewritten according to data that is supplied by the processor 11, so that the connection between the row wire set 51 and the column wire set 52 can be dynamically controlled as desired under the control of the processor 11.

Figure 5:
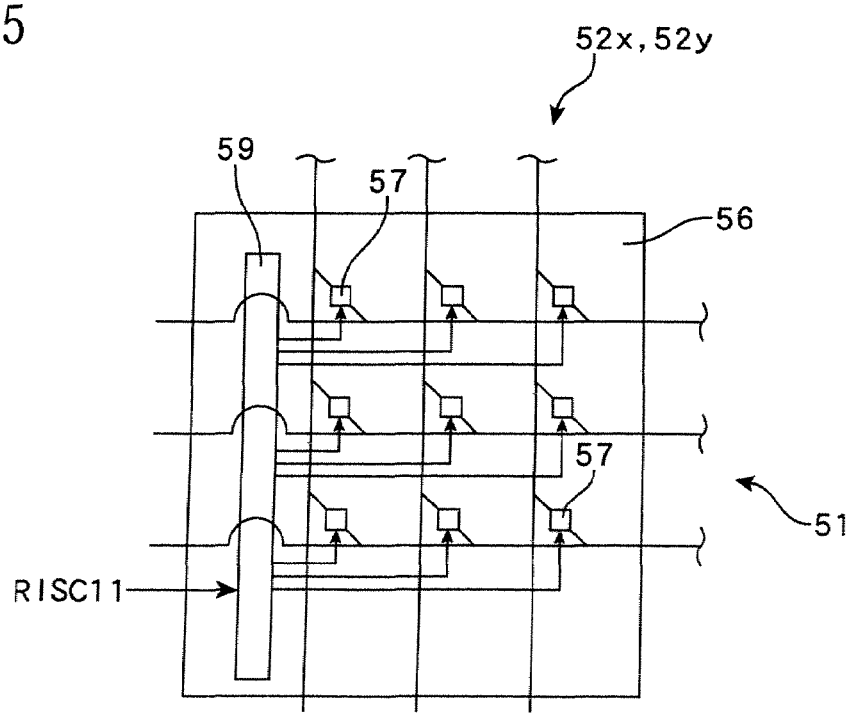
FIG. 5 shows an example of a switching unit.

A different type of switching unit 56 shown in FIG. 5 includes crossbar switches 57, each of crossbar switches 57 connects wiring that composes a channel of the row wire set 51 and wiring that composes a channel of a column wire set 52 so that the connections of channels can be changed. This type of switching unit 56 also includes a configuration RAM or register 59 in which data can be set by the processor 11, and can freely change the connection between the row wire sets 51 and the column wire sets 52.

As shown in FIG. 2, each operation unit 30 that is arranged in the matrix 20 includes a pair of selectors 31x and 31y for selecting input data from the column wire sets 52x and 52y, respectively, and a data path unit 32 that performs a special-purpose process on the input data $d_{ix}$ and $d_{iy}$ that have been selected by the selectors 31x and 31y and outputs the output data $d_o$ to the row wire set 51. The plurality of operation units 30 that are arranged in the matrix 20 include a plurality of kinds or types of operation units equipped with data paths that are suited to different kinds of special-purpose or specific processing. The operation units 30 that compose each row are each equipped with the same data path 32 that provides the same type of processing. This is to say, operation units 30 that are equipped with data paths 32 for executing different processing are arranged on different rows.

Figure 6:
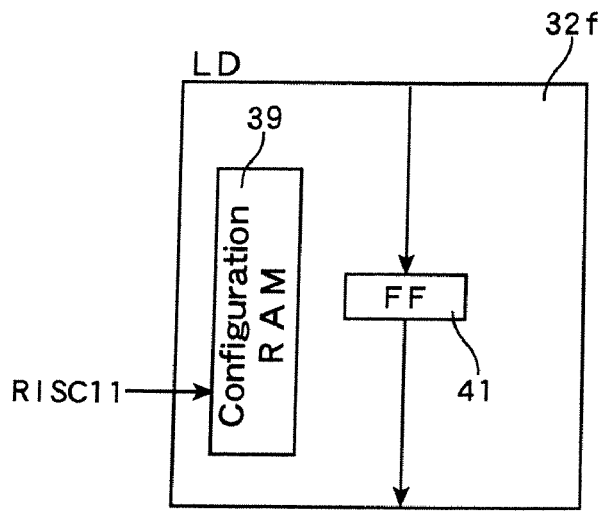
FIG. 6 shows an example of a data path unit that is suited to the processing for an instruction that inputs data.

The elements or operation units 30 that are arranged on the first row are connected to the load bus 22 and include data path units 32f that are suited to processing that loads data. One example of the construction of a data path unit (LD) 32f for a load is shown in FIG. 6. The LD 32f includes a flip-flop 41 that latches both input data and output data and a configuration RAM 39 that stores information for selecting a channel for cases where it is necessary to switch the channel for the output data. The LD 32f is a unit for executing an input instruction named "input" or "load". The LD 32f receives data from the load bus 22 and outputs data to the row wire set 51. It should be noted that the "LD" shown in FIG. 2 and the other abbreviations such as "BAL", "LDA", "SMA" and "DEL" that are explained later are used in this specification to indicate a type of data path unit 32 and the operation unit 30 that includes such type of data path unit 32.

The various operation units 30 described below each have a configuration RAM 39 and by setting the contents of these configuration RAMs 39 using the RISC 11, the connections between the operation units 30 and the row wire set 51 and the column wire set 52 can be dynamically switched. When the operation unit 30 is provided with a data path that can be switched, changed and/or selected by a selector and/or a function whose conditions and parameters, including initial values, can be set, the data path and/or function can be controlled by setting data in the configuration RAM 39.

Figure 7:
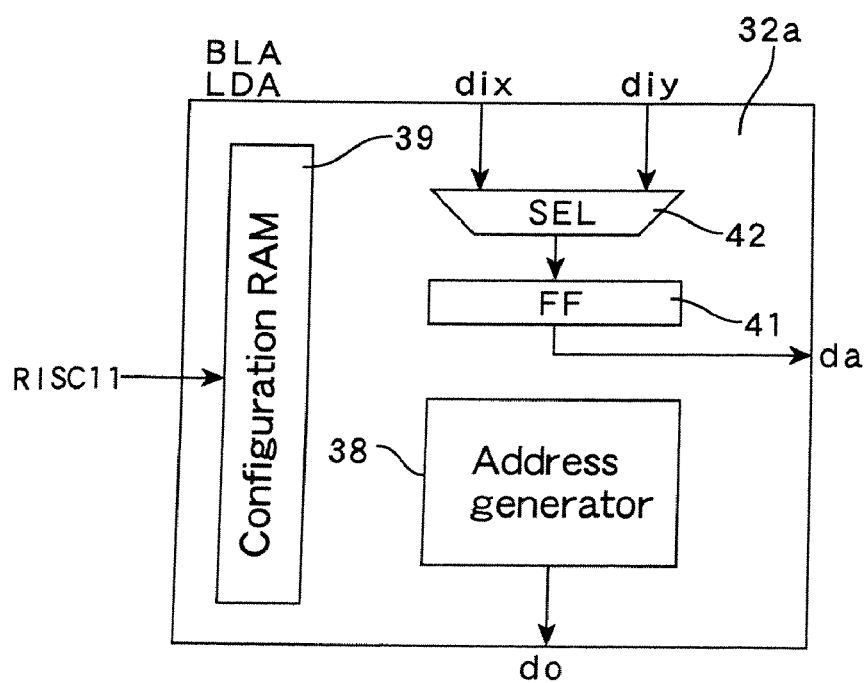
FIG. 7 shows an example of a data path unit that is suited to the processing for an instruction that outputs an address.

The operation units 30 that are arranged on the second and third rows each include a data path unit 32a that is suited to processing that outputs an address for loading data. One example of the construction of these data path units (BLA and LDA) 32a is shown in FIG. 7. The BLA and the LDA 32a are units for executing instructions (functions) that indicate an address for input data according to an instruction such as an "input.address_external" and an "input.address_internal". The BLA and the LDA 32a include an address generator 38 that is composed of a counter and others. An address is outputted by the address issuing circuit 38 as the output data $d_o$, and is supplied via the row wire set 51 and the column wire set 52 as the input data $d_{ix}$ or $d_{iy}$. Each data path unit 32a also includes a selector 42 for selecting either of the addresses that are supplied as input data and a flip-flop 41 that latches both the input data and output data. Accordingly, the loaded address data $d_a$ is outputted from the matrix 20 to the bus control unit 15. Each of these operation units 30 also includes a configuration RAM 39 for setting the states of the address generator 38 and the selector 42. The content (data) of the configuration RAM 39 is set by the processor 11, so that the connections of the row wire set 51 and the column wire set 52 can be dynamically changed and the settings of the address issuing circuit 38 can be freely changed.

The BLAs 32a of the operation units 30 that compose the second row of the matrix 20 issue an address for a block load. On the other hand, the LDAs 32a of the operation units 30 that compose the third row issue an address for loading desired data from the data that has been block-loaded. While there may be some differences in the detailed constructions of the data path units BLA and LDA, these units share the same overall construction shown in FIG. 7.

Figure 8:
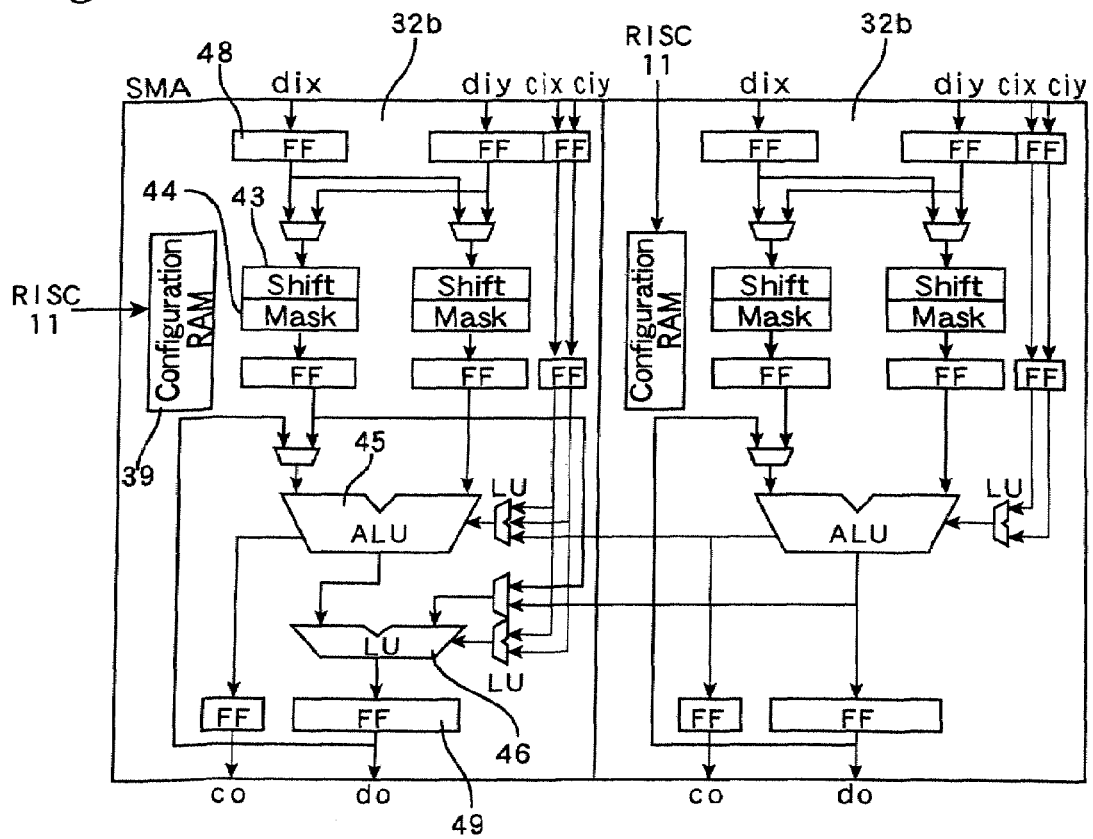
FIG. 8 shows an example of a data path unit that is suited to the processing for an instruction that performs an arithmetic operation and/or a logic operation.

The operation units 30 arranged on the fourth and fifth rows each include a data path unit 32b that is suited to arithmetic operations and logic operations. One example of the construction of these data path units (SMA) 32b is shown in FIG. 8. The SMA 32b is a basic element for computation and includes bit shift circuits 43 and mask circuits 44 for taking out the input data $d_{ix}$ an $d_{iy}$, which are supplied in byte or word unit, in bit units. Each SMA 32b also includes an ALU (arithmetic logic unit) 45 that can subject the input data $d_{ix}$ and $d_{iy}$ to addition, subtraction, comparison, a logical AND or a logical OR. Some SMAs 32b further include a logic unit (LU) 46 for combining and/or selecting a computational result of an adjacent SMA 32b.

The SMA 32b also includes a configuration RAM 39 for storing data that selects and/or changes the processing of the bit shift circuit 43, the mask circuit 44, the ALU 45 and the LU 46. The SMA 32b also includes a flip-flop 48 for latching the input data, a flip-flop 49 for latching the output data, and another flip-flop FF or the like for adjusting timing.

This SMA 32b supports arithmetic operation instructions and logic operation instructions, such as "add", "sub", "compare", "shift", "and", and "select" that are widely used when writing a program having functions addition, subtraction, comparison, selection and other logical operation. The setting as to which of these computational processes should be executed alone or in combination can be freely controlled according to the content of the configuration RAM 39 that is set by the RISC 11, and can be changed at any time. Also, fixed or immediate value can be set as the input data $d_{ix}$ and/or $d_{iy}$ using the configuration RAM 39. The setting conditions of the carry signals $C_{ix}$ and $C_{iy}$ is the same. It is also possible to construct a state machine or counter by providing a path that feeds back the output data $d_o$ to the ALU 45. A function for swapping the input data $d_{ix}$ and the $d_{iy}$ is also supported, and the function can also be used to increase the selection freedom and the usage efficiency of the column wire set 52.

The data path unit 32b is provided with a path that can input and select the carry signals $C_{ix}$ and $C_{iy}$, with it being possible to control the ALU 45 and the LU 46 according to these carry signals. A path for outputting the carry signal $C_o$ that is related to the operation result of the ALU 45 is also provided. The result of an operation performed on a carry signal of an adjacent SMA 32b can be inputted into the ALU 45 and the LU 46, and instead of just selecting a carry signal, operations can be performed on pairs of carry signals, so that carry signals can be used with a great deal of freedom.

The LU 46 provided in one SMA 32b out of a left-right pair of SMAs 32b can perform a logic operation on the output of the ALU of the SMA 32b on the left and the ALU of the SMA 32b on the right. To do so, the LU 46 is controlled by the configuration RAM 39 and an expanded function can be performed by the two SMAs 32b that are arranged in adjacent left-right positions in the row direction. As one example, when the input data $d_{ix}$ is 32 bits long, two pieces of input data $d_{ix}$ and $d_{iy}$ can be expressed as a single piece of input data so as to perform processing with double the accuracy (64 bits).

In the matrix 20 of the present embodiment, execution units 30 that include the SMA 32b form the seventh, eighth, eleventh and thirteenth rows.

Figure 9:
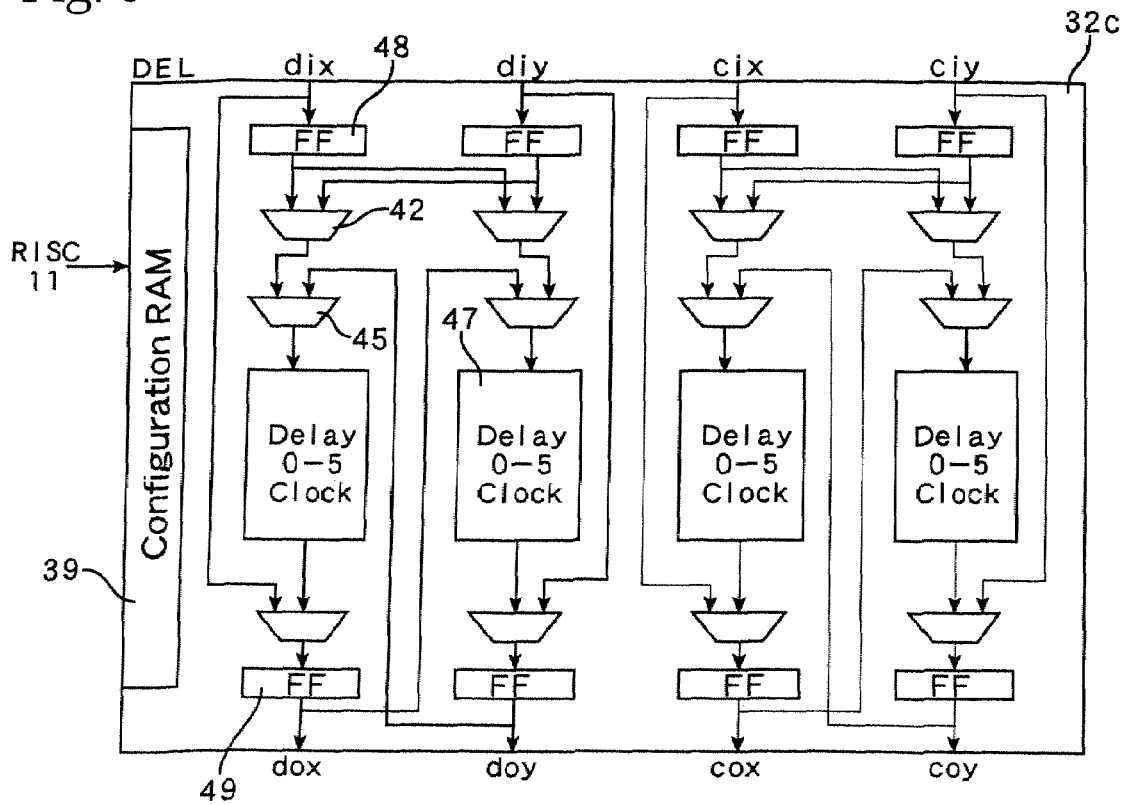
FIG. 9 shows an example of a data path unit that is suited to the processing that delays the timing at which data is transferred.

The operation units 30 provided on the sixth row each include a data path unit 32c that is suited to processing that delays the timing at which data is transferred. One example of the construction of this data path unit (DEL) 32c is shown in FIG. 9. The DEL 32c is composed of delay circuits 47 that are each composed of a combination of a plurality of selectors and a flip-flop, input-side flip-flops 48, output-side flip-flops 49, and selectors 42 for selecting circuits. The delay of each delay circuit 47 can be set at 0 to 5 clocks by the data in the configuration RAM 39, and a delay of 1 to 7 clocks in the X and Y system respectively can be controlled. According to the setting of the configuration RAM 39, the X system and the Y system can be serially connected and double the delay time can be applied. The carry signals $c_{ix}$ and $c_{iy}$ that are carried along with data by the row wire set 51 and the column wire set 52 can also be delayed and outputted by similar data paths.

By providing operation units 30 that are equipped with data paths DEL 32c for delaying, the delaying of signals in various kinds of data path units 32 can be adjusted as desired. Accordingly, it is possible to adjust differences in the delay time that occur when a data flow is formed by combining SMAs 32b for arithmetic operations and logic operations and MULs 32d for multiplication processes (described later) without having to provide each data path unit 32 with flip-flops and selectors for adjusting delays. This simplifies the construction of each data path unit 32, improves the applicability of data path units 32, and makes it possible to minimize the area occupied by each data path unit 32. Each data path unit 32 may be provided with an input-side flip-flop 48 for latching the input data and an output-side flip-flop 49 for latching the output data, or a flip-flop 41 for latching both the input data and the output data, so that the waiting time (latency) taken to output the input data as it is or after processing can be controlled in clock units. Accordingly, differences in latency can easily be compensated by the functions of the DEL 32c, and the timing of pipelines for computation by a combination of operation units 30 can be maintained.

The data path units DEL 32c also function so as to transfer data that has been supplied by the column wire set 52 to the row wire set 51. The operation units 30 that are arranged on the ninth row select data supplied by the column wire set 52 of the first matrix 28 and output the data to the row wire set 51 of the second matrix 29. In this way, the data of the first matrix 28 can be selected using the functions of the data path units DEL 32c for delaying and supplied to the second matrix 29, so that the column wire set 52 of the first matrix 28 can be separated from the column wire set 52 of the second matrix 29. The amount of wiring of the column wire set 52 can therefore be kept to the amount required to cover the number of operation units composing either the first matrix 28 or the second matrix 29, which makes it possible to reduce the area occupied by the wiring and to simplify the construction of the switching units 55 or 56 that select data from wiring group composed of wire sets.

The DEL 32c is automatically inserted for timing adjustments and the like when constructing a data flow in the matrix 20. It is also possible to write a "delay" instruction in a program so as to adjust the timing between data flows or between a data flow and the RISC processor, and in this case the DEL 32c is used as an operation unit for executing a delay instruction.

Figure 10:
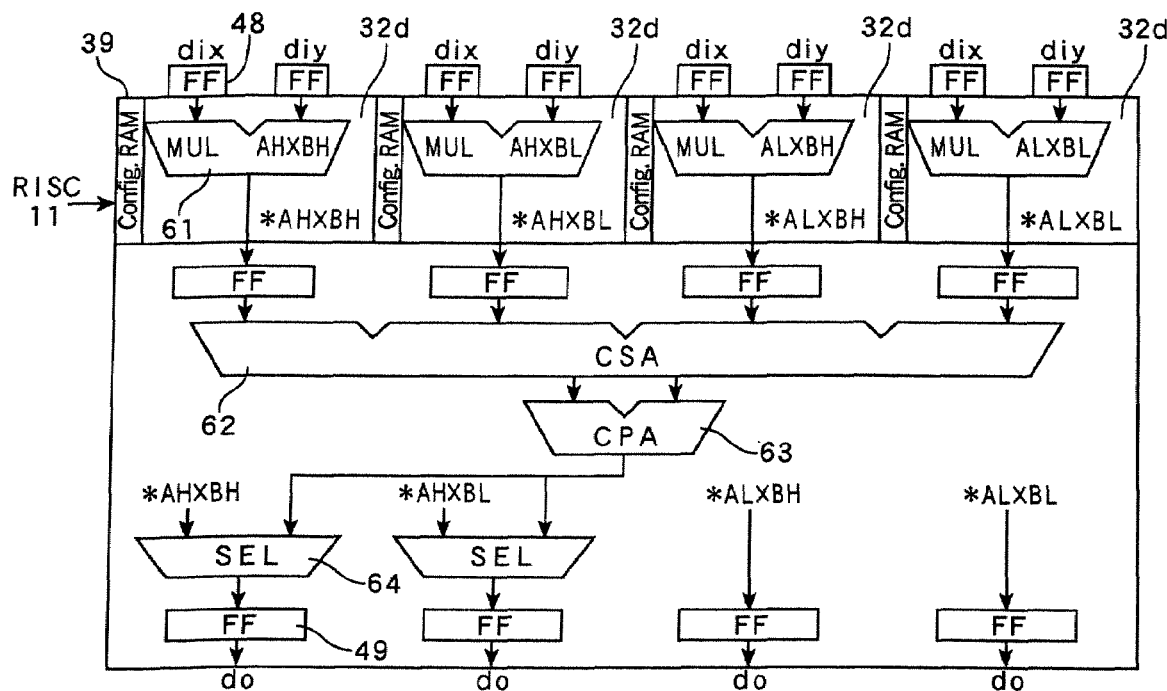
FIG. 10 shows an example of a data path unit that is suited to the processing for a multiplication instruction.

The operation units 30 that are arranged on the tenth row each include a data path unit 32d that is suited to the execution of multiplication processes that are indicated by a "multiply" instruction. One example of the construction of a data path unit (MUL) 32d is shown in FIG. 10. Each of the four MUL 32d includes a 16 bit*16 bit (32-bit result) multiplier MUL 61 arranged in the row direction. Data paths 62 and 63 are also provided for performing computational processing on the outputs from each of the four multipliers MUL 61. The functions of data path units MULs 32d for multiplication processing in the present embodiment can be expanded by combining the four MULs 32d that are arranged in the row direction. As one example, multiplications can be performed with twice the accuracy. Accordingly, the functions of the MUL 61, the CSA 62, the CPA 63, and the selector 64 are controlled by data that has been set in the configuration RAMs 39 of the data path units 32d.

In more detail, the MUL 61 on the extreme left (AH*BH) multiplies the higher 16 bits of the input data $d_{ix}$ with the higher 16 bits of the input data $d_{iy}$, the next MUL 61 (AH*BL) multiplies the higher 16 bits of the input data $d_{ix}$ with the lower 16 bits of the input data $d_{iy}$, the MUL 61 (AL*BH) multiplies the lower 16 bits of the input data $d_{ix}$ with the higher 16 bits of the input data $d_{iy}$, and the MUL 61 (AL*BL) multiplies the lower 16 bits of the input data $d_{ix}$, with the lower 16 bits of the input data $d_{iy}$. After this, the results of the multipliers are added together by the CSA 62 and the CPA 63, so that the four MUL 32d arranged in the row direction operate as a 32-bit*32-bit (64-bit result) multiplier. While it is possible to obtain the same result by adding the multiplication results of each MUL 32d using the SMAs 32b, by arranging the MUL 32d in a line in the row direction and adding a small amount of special-purpose wiring for a calculator that performs addition, the same result can be obtained with a short delay and low number of gates.

Instead of arranging the MUL 32d, a data path unit (SMAM) produced by adding a multiplication function to an SMA 32b may be arranged in place of an SMA 32b or together with an SMA 32b. How many computational functions is included in one operation unit 30 and how to select and use the functions in the operation unit by setting the configuration RAM 39 are depends on the design concept of the matrix 20 and can be differ from the embodiment. In the present invention, a matrix 20 comprises a plurality of types of operation units 30 that include different data paths, even if there are differences in range or applicability of the content of process that can be handled per one operation unit 30. Accordingly, compared to a matrix in which processing units that have the same construction and support all kinds of processing are laid out, there is a clear reduction in the amount of redundant and useless space, redundant and useless processing time is reduced, and the AC characteristics are improved.

Figure 11:
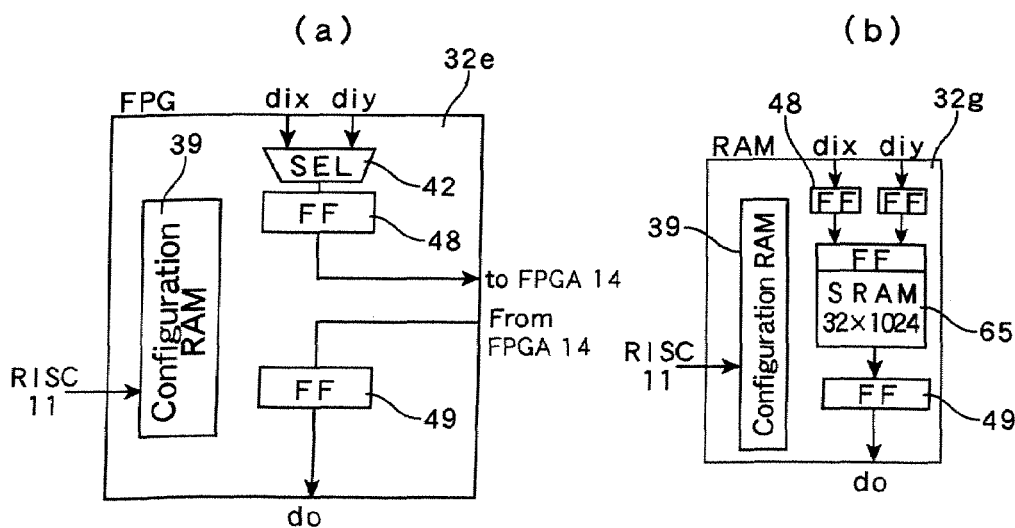
FIG. 11(a) shows an example of a data path unit that is suited to the processing that connects a computational circuit located in the outside.
FIG. 11(b) shows an example of a data path unit whose processing is selected according to a lookup table.

The operation units 30 arranged on the fourteenth row each include a data path unit 32 as an interface for an FPGA 14 that is provided out side the matrix 20. The construction of a data path unit (FPG) 32e that functions as an interface is shown in FIG. 11 (a). The FPG 32e includes a selector 42 for selecting input data, a flip-flop 48 for latching the input data and supplying the input data to the offchip FPGA 14, and a flip-flop 49 for latching the output from the offchip FPGA 14 and setting the output as output data. By using this FPG 32e, a processing in the matrix 20 can be continuously performed by supplying input data to the offchip FPGA 14 and returning the data to the matrix 20 after processing in the FPGA 14. Operation units that support instructions which appear very frequently in an application program executed by the LSI 10 are selected, designed and arranged as the operation units 30 provided in the matrix 20. If provided, operation units 30 that include functions with limited applicability would lower the area efficiency, so that such operation units 30 are not arranged in the matrix 20. By providing data path units FPG 32e, such processes and functions with limited applicability can be processed at high-speed using hardware.

Each FPG 32e is the data path unit that introduces an external interface into the matrix and has favorable general-purpose applicability, with the external processing circuits that can be connected not being limited to FPGAs. FPGs 32e can connect ASICs or other LSIs that may include the matrix 20 of the present embodiment.

The operation units 30 that are arranged on the fifteenth and sixteenth rows include the data path units STA and BSA that are suited to issuing addresses for store operations. The data path units STA and BSA execute instructions that indicate the output address, the instructions format are the same as that of the instruction that indicate the input address mentioned above. The same kind of circuit as the data path unit 32a shown in FIG. 7 can be used as the function for issuing an address. Two types of address are issued for a store, with the data path unit BSA issuing an address for storing data that has been converted into blocks and the data path unit STA issuing an address for pre- blocks.

Operation units 30 that include data path units ST that are suited to outputting data according to instructions such as "output" and "store" are arranged on the seventeenth row at the bottom. While these data path units are referred to as data path units ST, data path units with almost the same construction as the data path units 32*b* for arithmetic operations can be used. When an external storage address is indicated for the result of arithmetic operations in the matrix 20, data is outputted via an operation unit ST.

The types of operation units 30 in the present invention are not limited to the examples given above. FIG. 11(*b*) shows the construction of a data path unit (RAM) 32*g* that includes an SRAM 65 for a lookup table. The input data $d_{ix}$, can be used as an address and the input data $d_{iy}$ can be used as data, so that a write is performed when data and an address are simultaneously provided and a read is performed when only an address is provided. The SRAM 65 is equipped with a plurality of banks, the usage of which can be switched according to the settings of the configuration RAM 39. When four RAMs 32*g* are arranged in a line in the row direction, the RAMs 32*g* can be used as four 8-bit RAMs, two 16-bit RAMs, or one 32-bit RAM. The data path unit 32*g* can be used as a lookup table for obtaining output data according to a desired function performed on input data in byte or word units. This is useful when a cosine transform process or a CRC calculation is realized by the matrix 20.

The system LSI 10 of the present embodiment is one example of an integrated circuit device, and includes a plurality of operation units 30 that are arranged in a matrix in a first direction (in the present embodiment, the row or horizontal direction) and in a second direction (in the present embodiment, the column or vertical direction). The plurality of operation units 30 include a plurality of kinds or types of operation units including data path units 32 that are suited to different special-purpose processing, with the data path unit 32*f* that is suited to inputting data, the data path unit 32*a* that is suited to processing for issuing an address of data, the data path unit 32*b* that is suited to processing for arithmetic or logic operations, the data path unit 32*d* that is suited to multiplication processes, and the data path unit 32*c* that is suited to processing that delays the transferring of data being given above as examples. The connections between the row wire sets 51 and the column wire sets 52 that transfer data between the plurality of types of operation units 30 are controlled by the switching units 55, and by changing the connections between these operation units 30, dataflow-type special-purpose computation circuits that execute desired data processing can be defined in the matrix 20. This means that the matrix 20 of the present embodiment can be reconfigured as special-purpose computational circuits with different processing contents in a short time by changing the connections between the operation units 30, without having to change all of the connections between the transistors as is the case with an FPGA. Unlike the logic blocks of an FPGA, the operation units 30 do not have an architecture for which general applicability is demanded at the transistor level, and each operation unit 30 includes a data path unit 32 that is dedicated to special-purpose processing, so that redundant circuitry can be omitted and the packing density can be improved. Accordingly, it is possible to provide a compact, economic system where the processing content of the hardware can be changed. The amount of redundant components can be drastically reduced, so that compared to an FPGA, a large increase can be made in processing speed and the AC characteristics can also be improved.

As shown in FIGS. 6 to 11, the data path units 32*a* to 32*g* that are suited to different processes have different constructions. Therefore each data path unit is capable of executing its intended processing at high speed, but there are differences in the area occupied by each data path unit. For this reason, in the matrix 20 of the present embodiment, operation units 30 that include data path units 32 with the same function are arranged in lines in the row direction, so that even if the area occupied by an operation unit 30 differs according to the type of data path unit 32 in the operation unit 30, linearity can be maintained in the row direction. Even though the types of data path unit 32 are different, by making the intervals between rows equal so that the pitch in the row direction is the same, linearity can be maintained in the column direction as well. This makes it possible to lay out the row wire sets 51 and the column wire sets 52 in linear manners.

That is, by arranging the operation units 30 with the same data path unit 32 in the row direction with equal intervals between them, the differences in size between the operation units 30 can be absorbed by the intervals in the column direction, so that even if the intervals in the column direction change row by row, linearity can be maintained and wires can be laid out linearly as the row wire set 51. It is possible to design the matrix 20 with the row direction and column direction being interchanged, with such a matrix also falling within the scope of the present invention.

As described above, it is possible to arrange operation units 30, which are of different sizes and have data path units 32 with different constructions, in a matrix with extremely high efficiency. It is also possible to linearly arrange the wiring group (buses) of row and column wire sets that connect these operation units 30. Accordingly, a reconfigurable integrated circuit device where the functioning can be set after manufacturing can be provided more compactly and at low cost. Compared to an FPGA, operation units 30 which are capable of high speed processing and have favorable AC characteristics can be arranged in a more compact layout and connected with the shortest possible wiring, so that an integrated circuit device that makes the most of such high processing speeds can be provided.

In this way, arranging operation units 30 that have data path units 32 with the same function in the row direction is effective when having the matrix 20 function as a data flow-type processing device or apparatus. As one example, in the above case, the operation units 30 for inputting data are arranged in the first row that is at one end in the column direction and operation units 30 for outputting data are arranged in the seventeenth row that is at the other end in the column direction. When looking from a broad perspective, a data flow or data flows that are orientated from the top to the bottom are formed in the matrix 20, with operation units 30 that are suited to other processes being arranged corresponding to the data flows. It is also possible to form a data flow or data flows that are orientated from the bottom to the top using the row wire sets 51 and the column wire sets 52, thereby making it possible to perform data processing that make maximum use of the operation units 30 arranged in the matrix 20.

As with the data path unit 32*b* that is suited to arithmetic operations and the data path unit 32*d* that is suited to multiplications, the same kind of operation units 30 can be linked by arranging the operation units 30 in the same direction. In the matrix 20, the operation units 30 can be used separately and expanded computational functions, such as operations with increased accuracy, can also be provided by grouping or linking the operation units arranged in the row direction.

Each operation unit 30, each switching unit 55 or 56 includes a configuration memory by which these units are separately controlled by setting data from the processor 11. Accordingly, the configuration of the operation units 30 can be freely changed by the processor 11 and, unlike an FPGA where a circuit is mapped at the transistor level, it is possible to change the configuration of operation units 30 that include data path units 32 suited to special-purpose processing which is implemented or constructed in advance, so that the functioning performed by combination of the operation units 30 can be changed in a short time, almost in one clock.

In addition, in each operation unit 30, the functioning of the logic gates, such as the selectors and the ALU, that compose the data path unit 32 can be set separately by the processor 11 via the configuration RAM 39. As a result, the functions of an operation unit 30 itself can be flexibly changed within the range of functions that can be serviced by the data path unit 32. With the matrix 20 of the present embodiment, an extremely wide range of functions can be processed by dataflow or pseudo dataflow. It is possible to select and arrange types of operation units 30 that are suited to an application for which the LSI 10 is used, such as network processing or image processing, so that an integrated circuit device with a high packing efficiency can be realized.

It should be noted that in addition to it being possible to interchange the row wire sets 51 and the column wire sets 52 that are described above in the present embodiment, rows and columns may be interchanged as the arrangement directions of operation units 30. Data may also be inputted and outputted into and from the operation units 30 via either of the row wire set and the column wire set. However, as shown in the matrix 20 described above, by setting a rule whereby data is inputted via one of the wire sets (the column wire set 52 in the above example) and is outputted via the other wire set (the row wire set 51 in the above example), data can normally be transferred from one operation unit 30 to another via one switching unit 55.

Figure 12:
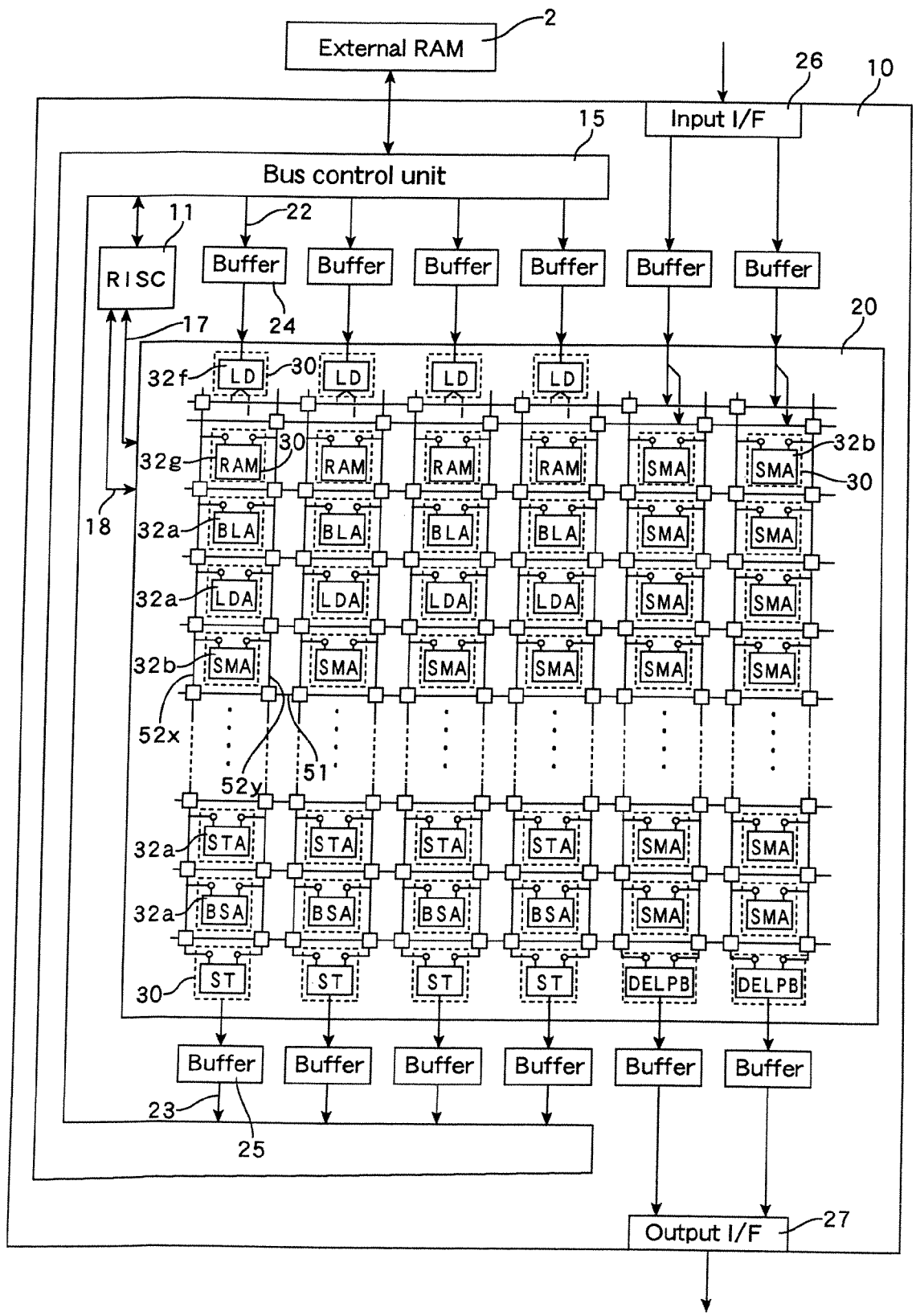
FIG. 12 is a block diagram showing the construction of another integrated circuit device according to the present invention.

FIG. 12 shows a different example of an LSI to which the present invention relates. In FIG. 12, the interrupt control unit 12 and the clock generating unit 13 are omitted, though the same types of unit are included as in the LSI as shown in FIG. 1. In the matrix 20 of the LSI 10 of the present example, six operation units 30 are arranged on the rows from the second row onwards. Of these, the four operation units 30 on the left are operation units 30 that each include a data path unit 32g that functions as a RAM, operation units 30 that each include a data path unit 32a that functions as a BLA for issuing an address of data to be loaded, and operation units 30 that each include a data path unit 32a that functions as an LDA also for issuing an address. However, the two operation units 30 on the right of each row are operation units 30 that each include a data path unit 32b that functions as an SMA which supports arithmetic and logic operations. This is because when selecting the operation units 30, it is necessary to select a larger number of operation units that function as SMAs 32b than other types of operation units in order to satisfy the specification that is demanded for the present LSI 10. As before, it is possible to design the matrix 20 by arranging the SMA 32b logic units in the same way as the arrangement of the other types of operation units, with four operation units 30 being arranged in a line on each row. While it depends on the arrangement of the other units that compose the LSI 10, in view of the matrix 20 alone, however, such arrangement is elongated in the height or longitudinal (column) direction, which lowers the area efficiency. Also, since there is an increase in the number of rows in the longitudinal direction, the load of the column wire set 52 increases, and the number of segments increases, resulting in the need for DEL 32c logic units and a lowering of the processing speed.

In the matrix 20 of the present example, the large number of operation units 30 having SMA 32b are arranged by adding other type of operation units 30 in the row direction, so that the overall shape of the matrix 20 is closer to a square. In this matrix 20, all of the operation units 30 arranged on the same row are not necessarily the same type. However, within the area in which the less numerous operation units 30 including such as the RAM 32g, the BLA and the LDA are arranged, the same type of operation units 30 are arranged in the row direction, so that linearity is maintained in the row direction. Linearity in the column direction is maintained as described earlier by arranging the various types of operation units 30 with an equal pitch in the row direction.

In the matrix 20 of the present example, six input buffers 24 and six output buffers 25 are respectively arranged on the load bus 22 and the store bus 23. Of these, two input buffers 24 and two output buffers 25 are connected to an extension input (expansion or open-end) interface 26 and an extension (expansion or open-end) output interface 27, respectively, in place of the bus control unit 15. The extension interfaces 26 and 27 are used as interfaces between matrices 20. Accordingly, it is possible to arrange a plurality of matrices 20 on the same chip and to connect the matrices 20 using the extension interfaces 26 and 27, or to connect a plurality of chips 10 with matrices 20 using the extension interfaces 26 and 27.

By using the extension interfaces 26 and 27, a dataflow-type computer or processor can be expanded or extended by using a plurality of LSIs 10 that include matrices 20. By increasing the number of matrices 20 that can be connected, the number of operation units 30 that can be connected can be increased, thereby making it possible to execute more complex processing. This also increases the range by which the matrices can be reconfigured by changing the configuration of the operation units 30, so that an even more flexible integrated circuit device can be provided. Configurations of operation units 30 with improved performance, such as increased parallelism, can also be selected flexibly. It is also possible to construct a three-dimensional matrix by arranging a plurality of matrices 20 in three dimensions.

Figure 13:
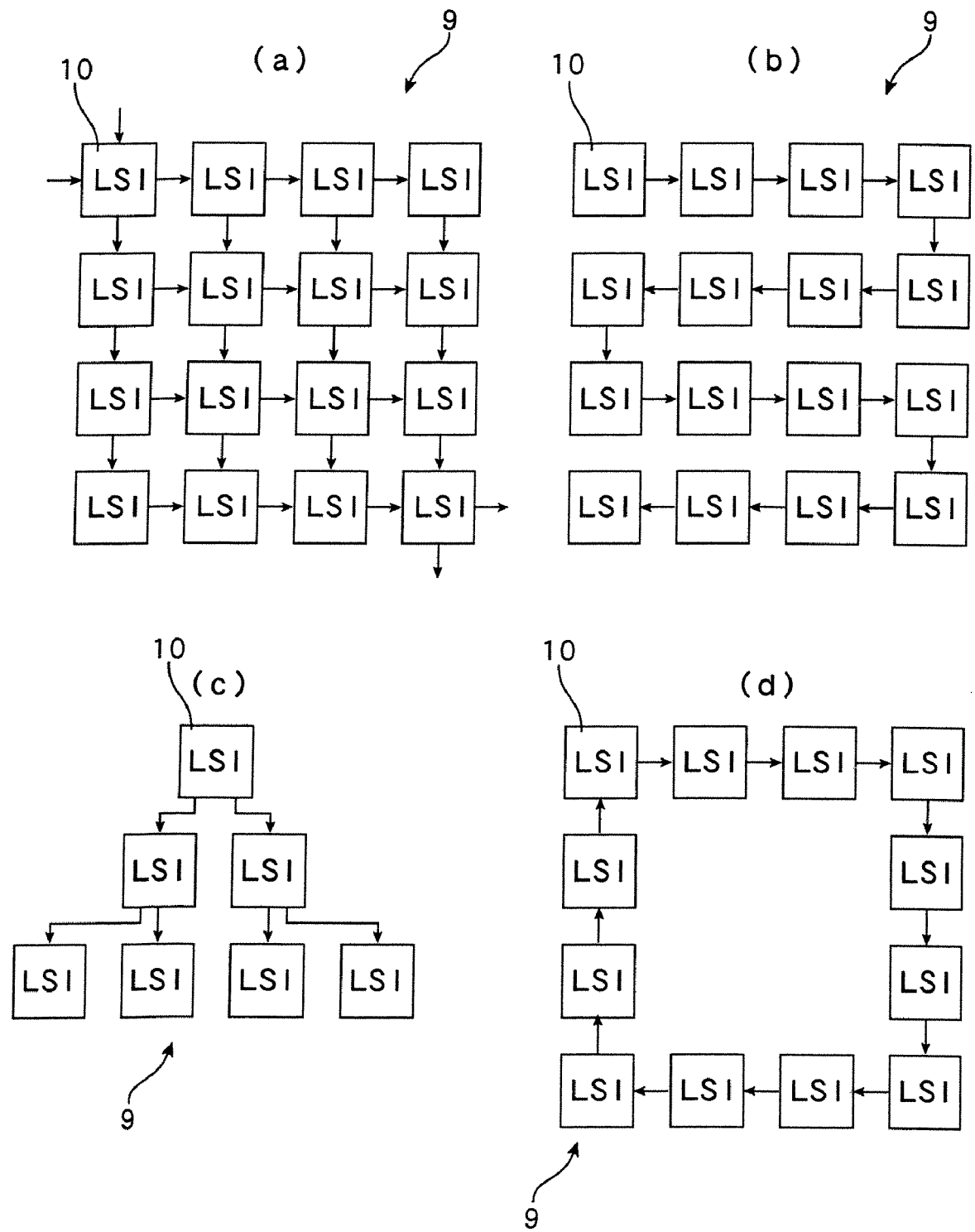
FIG. 13 shows several examples of where a plurality of LSIs have been connected.

FIG. 13(a) shows a computational processing system or integrated circuit device 9 in which the matrix 20 has effectively been expanded by n times by connecting n LSIs 10 using the extension interfaces 26 and 27. Such LSIs can be combined in two dimensions or in three dimensions.

In a system 9 in which a plurality of LSIs 10 are connected, it is possible to use the extension interfaces 26 and 27 as buses for transmitting the required information to a plurality of matrices 20 or the LSIs 10 that include such matrices 20. FIGS. 13(b) to 13(d) show various examples. In FIG. 13(b), the LSIs 10 are connected by the expansion interfaces in a chain. In FIG. 13(c), the LSIs 10 are connected in a tree-like pattern. In FIG. 13(d), the LSIs 10 are connected in a ring-like pattern.

A simple algorithm may be used to transmit data, and as one example, a simple program may be provided in advance for transmitting the initial settings to every LSI 10. The LSI (the first LSI in the chain when a chain-like connection pattern is used, the LSI at the top of the tree when a tree-like connection pattern is used, or any LSI in a ring of LSIs) that controls the system 9 informs the next LSI 10 of information in the form of data and a token, and the LSI that receives this information treats the information as information intended for itself and simultaneously passes the information onto the next LSI 10. In each matrix 20, the judgment of the content of the information and as to whether the information is intended for this matrix 20 can be defined using any of the operation units 30 in the matrix 20. The transfer destination of the information may be an operation unit 30 that includes a RAM function, the RAM of the processor 11, or the configuration RAM 39 of each operation unit 30.

The information that is transmitted includes a program 3 for the RISC processor 11, information that is set in a configuration RAM 39 in the matrix 20, and the like. To set information in a configuration RAM 39, setting information that is received from the extension input interface 26 can be written via the output bus 23 and the bus control unit 15 by indicating the address of a configuration RAM 39 of an operation unit 30 using the store function of a matrix 20. The information can be stored temporarily in an external DRAM 2, and can be transferred to the configuration RAM 39 using the functions of the processor 11.

The transmitted information also includes information for control over timing. Data can be transmitted with a constant cycle (such as intervals of one second) as a base clock for the system 9, so that the processing in the plurality of LSIs 10 that compose the system 9 can be synchronized.

Figure 14:
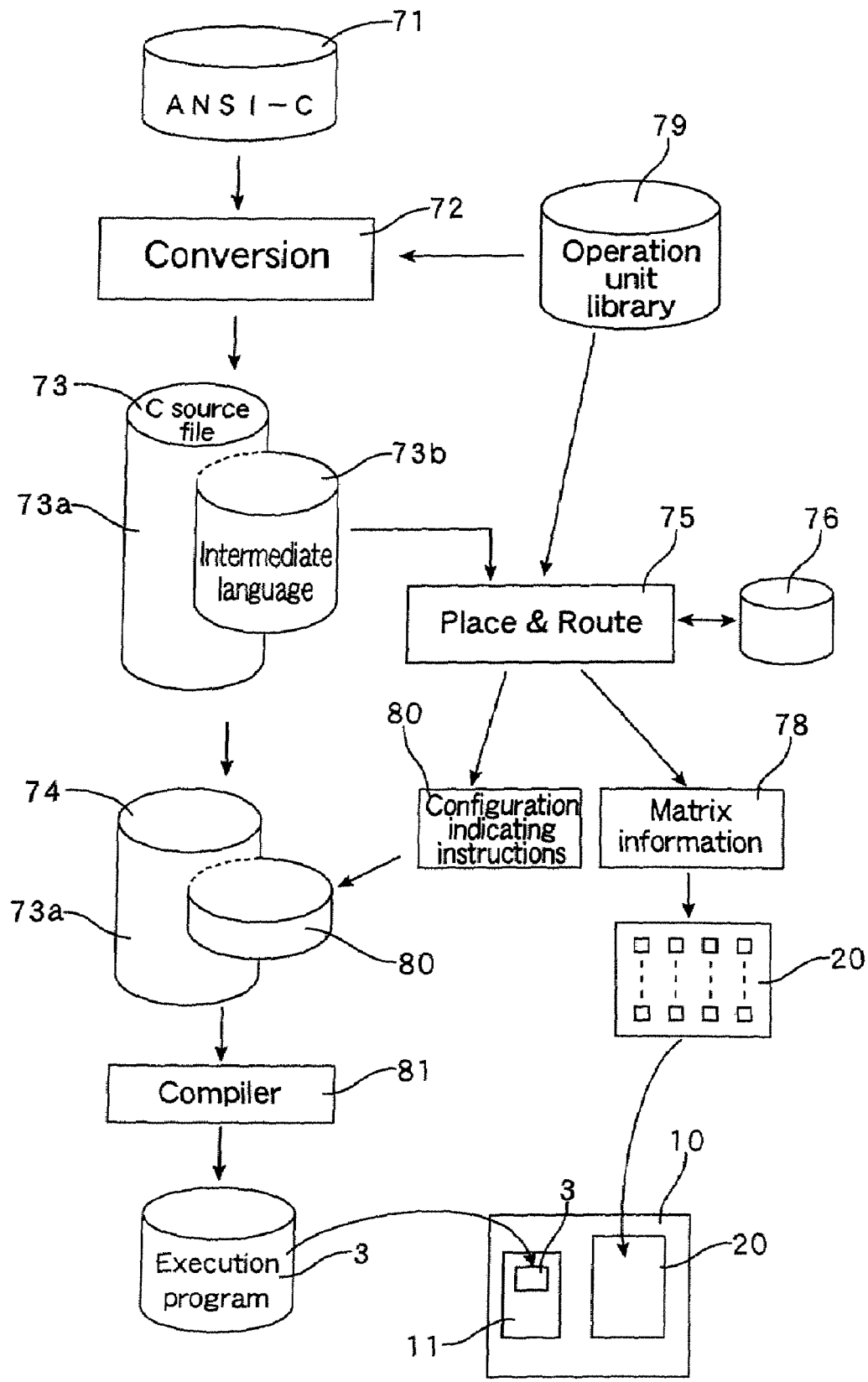
FIG. 14 shows a method of designing and manufacturing the integrated circuit device of the present invention.

FIG. 14 shows the method of designing and manufacturing an LSI 10 of the present embodiment. Once the processing to be executed by the LSI 10 has been provided as the specification 71, a process 72 for converting the specification 71 into a source file 73 that is written in a programming language for execution by the LSI 10 is performed. This conversion process 72 refers to an operation unit library 79 and converts the specification 71 that is written in a standard high-level language such as ANSI-C is converted into an intermediate expression 73 that is written in a programming language (hereafter "intermediate language") including instructions that are supported by the operation units 30. This conversion process 72 may be performed manually, or may be executed using software such as a compiler.

Of the operation units 30 that compose a matrix 20, the operation unit LD includes the data path unit 32f and is suited to the processing for an input instruction for inputting data. The operation units BLA and LDA include data path units 32a and are suited to processing for instructions that indicate the addresses of input data. The operation unit ST is suited to the processing for an output instruction for outputting data. The operation units BSA and STA include data path units 32a and are suited to the processing for instructions that indicate addresses for data that is outputted. The operation unit SMA includes the data path unit 32b and is suited to the processing for arithmetic operation instructions and/or logic operation instructions, and the operation unit MUL includes the data path unit 32d and is suited to the processing for multiplication instructions. These operation units 30 process data in byte or word unit, therefore, one operation unit 30 is suitable to execute the processing for one instruction or a plurality of instructions.

Accordingly, the plurality of types of operation units 30 that compose the matrix 20 can be said to support input and output instructions for data, arithmetic operation instructions and logic operation instructions, so that input and output processing of data, arithmetic processing and logical processing can be described using instruction sets (intermediate language) that are supported by the operation units 30. For processes that repeatedly perform input/output processing, signal processing, and arithmetical operation processing and/ or logical operation processing, which is to say, loop processes, it is difficult to increase the processing speed if a RISC processor 11 is used and the processing is repeated in software using limited hardware resources. On the other hand, with the matrix 20 of the present embodiment, such process can be distributed on a large number of hardware resources that are available in the form of operation units, and performance can be improved by having these operation units operate simultaneously in parallel. Accordingly, the processing speed can be raised in an easy manner by finding such processes with a performance analyzer or the like, and then converting the processes into hardware.

Figures 17, 18:
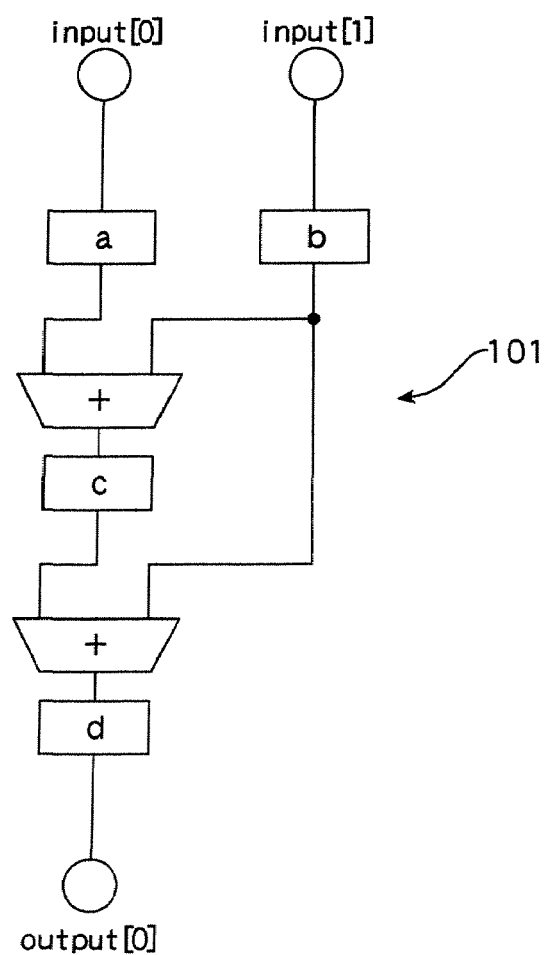
FIG. 17 shows an example of an intermediate language description.
FIG. 18 shows an example of a data flowgram that is realized in the matrix.

The intermediate expression produced by converting the provided specification 73 includes a part 73a that is written in C language and is executed by the RISC processor 11 and a part 73b that is written in the intermediate language so that it is executed by the matrix 20. The part 73b, which is the intermediate expression in the form of the intermediate language, is as shown in FIG. 17. The part 73b in which the instructions that are supported by the operation units 30 are reflected, is a description that expresses the processing procedure in a manner that can be converted into data flowgrams or a control data flowgrams which are data flowgrams with added control information. Accordingly, unlike an HDL (Hardware Description Language) or the like, the specification of the system can be understood by the designer, so that when the system has been changed or modified, such changes or modifications can be easily reflected in the intermediate description 73b. One type of intermediate languages is assembler-like languages, such as macroassembly-like languages. Such languages are less difficult than C language and keeping linearity is easier, so that data flowgrams are easy to produce, and it is easy to understand what configuration has been used when such data flowgrams have been mapped onto a matrix 20. Accordingly, such languages facilitate the development of both matrices 20 and programs, with debugging and maintenance also being easy.

The part 73b that is described in the intermediate language is written in instructions that are supported by the operation units 30, so that the processing of this part 73b can be expressed as a configuration of operation units 30 in a matrix 20. Then, the place-and-route process 75 generates a configuration or configurations ("execution configuration") 76 of operation units 30 that can execute the processing 73b that is described in the intermediate language. This process is performed by a compiler (software). Once the execution configuration 76 has been generated, information 78 of a matrix 20 in which the operation units 30 are arranged so as to realize the execution configuration 76 is outputted. If the matrix 20 is produced based on this information 78, the fundamental designing of the LSI 10 is complete, and based on this the LSI 10 can be manufactured. Also, instruction 80 for indicating the execution configuration 76 is generated. Then, a C source file 74 that includes, in place of the intermediate language description 73b, the instruction 80 that indicate the execution configuration 76 and instruction that launch this configuration is generated and is complied by a C compiler to generate the program (object program) 3 that is executed by the LSI 10.

If it is not necessary to change the configuration of the operation units 30 in the matrix 20 to execute the provided specification 71, it is not necessary to generate instructions indicating the configuration and it is sufficient to generate a matrix 20 including operation units 30 that can execute the processing of the part 73b written in the intermediate language. When the provided specification 71 is executed using an existing matrix 20, a matrix 20 is not generated. In such case, instruction 80 for setting the configuration of the operation units 30, which are already arranged in the matrix 20, into the execution configuration 76 is generated for replacing the part 73b that is written in the intermediate language, and then compiling by which a execution program 3 is generated.

In order to adjust the timing of the processing between or among the operation units 30, in the place-and-route process 75, the execution configuration 76 that includes operation units DEL for delaying, which include the data path unit 32c, must be generated. In the place-and-route process 75, it is necessary to find an appropriate configuration by repeatedly performing the steps of designing a matrix 20 with different layout and of confirming whether all of the execution configurations can be applied using an appropriate algorithm.

The configuration of the internal data path in each of the operation units 30 can also be changed or selected using the configuration RAM 39. In an operation unit SMA that includes the data path unit 32b, the content or details of the operation needs to be set using the configuration RAM 39. Accordingly, in the place-and-route process 75, it is necessary to generate an execution configuration that includes the configurations of the internal data paths 32 of the operation units 30 that are combined. The settings of the operation units 30 are supplied to the matrix 20 so that these settings become active in the configuration RAM 39 in each operation unit 30 by an instruction in the execution program 3 that indicates the configuration.

Figure 15:
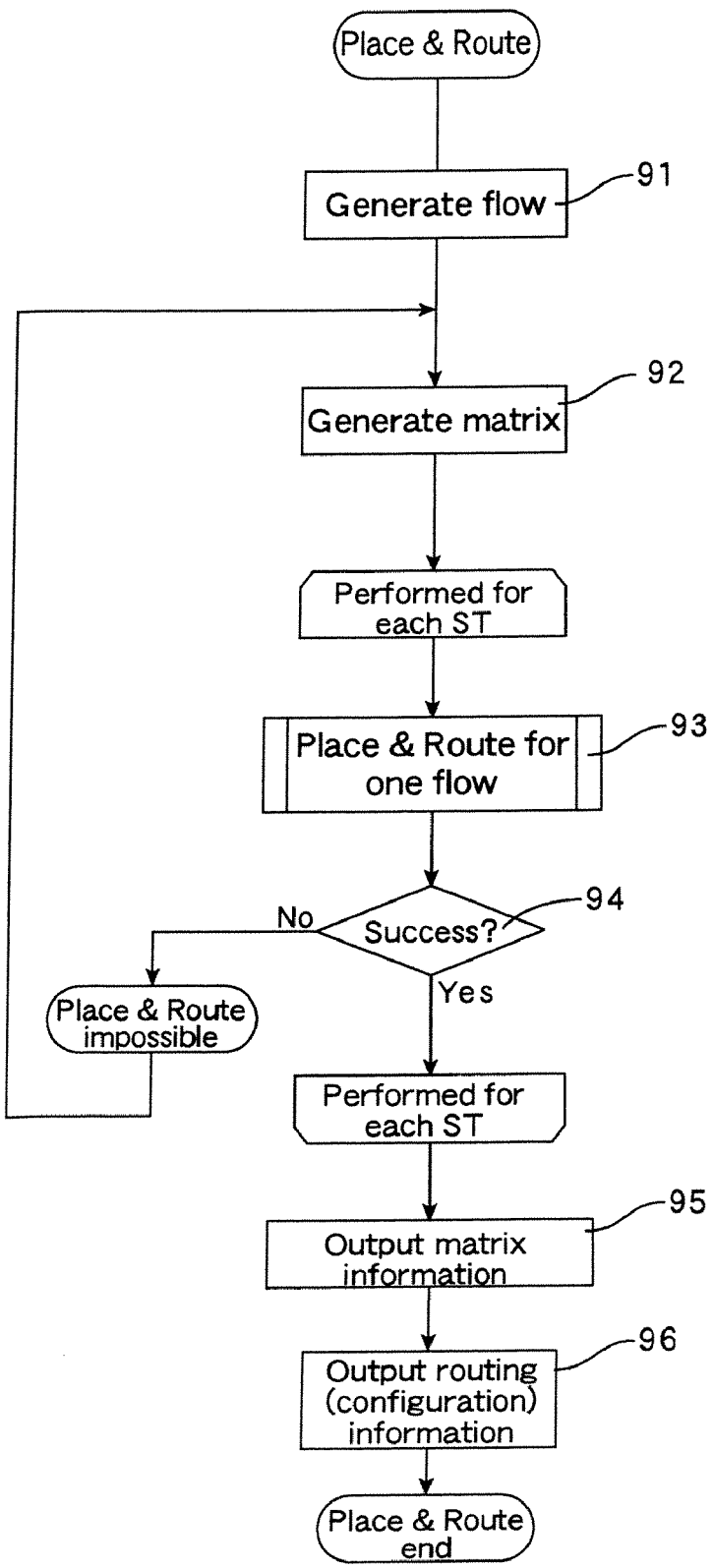
FIG. 15 is a flowchart showing the place-and-routing process.

The following describes the process of generating a configuration of operation units 30 with reference to FIGS. 15 to 21. FIG. 15 is a flowchart showing the processing of the compiler 75 that performs the place-and-route process. First, in step 91, the data flowgram (DFG) 101 shown in FIG. 18 is generated from the intermediate language description 73b shown in FIG. 17. When a plurality of data flowgrams 101 are necessary, such data flowgrams 101 are generated. Next, in step 92, a matrix 20 with an appropriate layout that includes operation units 30 that can compose these data flowgrams 101 is generated, and in step 93, placing and routing is performed for each data flowgram 101 separately, so that the layout of a matrix 20 to which all of the data flowgrams 101 can be assigned and an execution configuration corresponding to the matrix 20 are found. In step 94, when one or more data flowgrams 101 is not possible in the place-and-route process, result of the place-and-route process is deemed to be impossible for the present matrix, and the processing returns to step 92 where a matrix 20 with a new layout is generated. Operation units ST that perform processing for outputting data are located on the output side of the matrix 20, and if data flowgrams 101 can be assigned using up to all of the operation units ST, the result of the place-and-route process is deemed to be succeeded.

Figure 16:
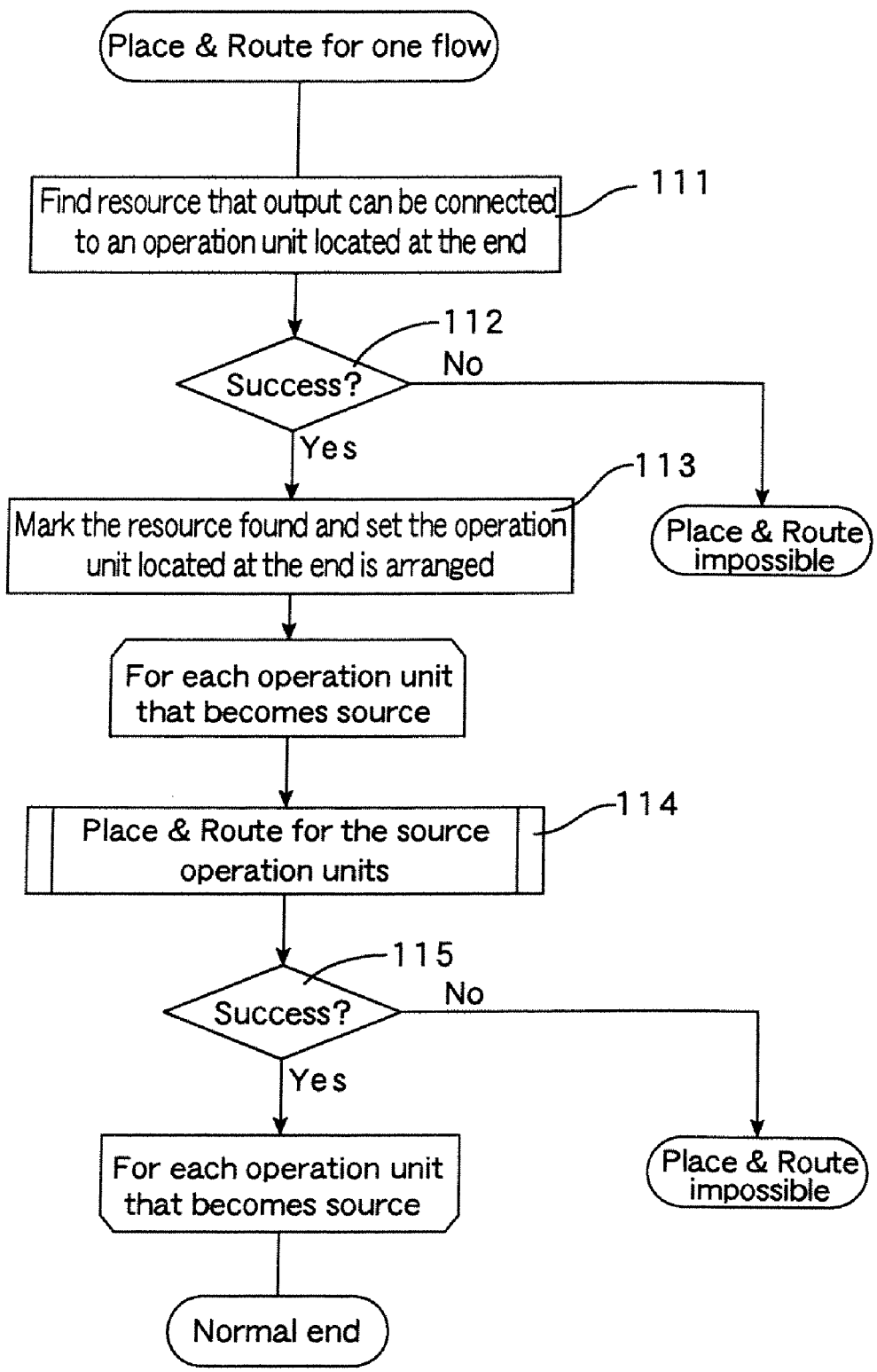
FIG. 16 is a flowchart showing the processing that finds a configuration for one data flowgram.

In FIG. 16, a flowchart shows the processing for generating a configuration of operation units 30 for executing one data flowgram 101. To make it easy to keep the latency, it is preferable for the operation units 30 to be assigned in order starting from the downstream end of the data flowgram 101. Accordingly, in step 111, followings are confirmed that whether the operation unit for the end part of the data flowgram 101 can be found at the suitable position, and i whether such operation unit can be wired to the operation unit ST that outputs data. In step 112, if the appropriate operation units 30 and wire sets that connect the operation units 30 can be found, the result of the place-and-route process in that step is deemed to be succeeded. Next, in step 113, the found resources that are the operation units 30 and the wire sets are marked, and the end operation unit 30 is marked as having been laid out. After this, in step 114, it is confirmed, by tracing the data flowgram from the downstream end to the upstream end, whether an operation unit 30 that becomes the input source for the operation units 30 marked as having been laid out can be find out and to which wiring or routing can be possible. In step 115, when the input source operation unit 30 can be found at a suitable position and to which routing can be possible, and all of the input source operation units 30 can be found or laid out and to which wiring can be possible, the data flowgram 101 is configured in the matrix 20.

Figure 19:
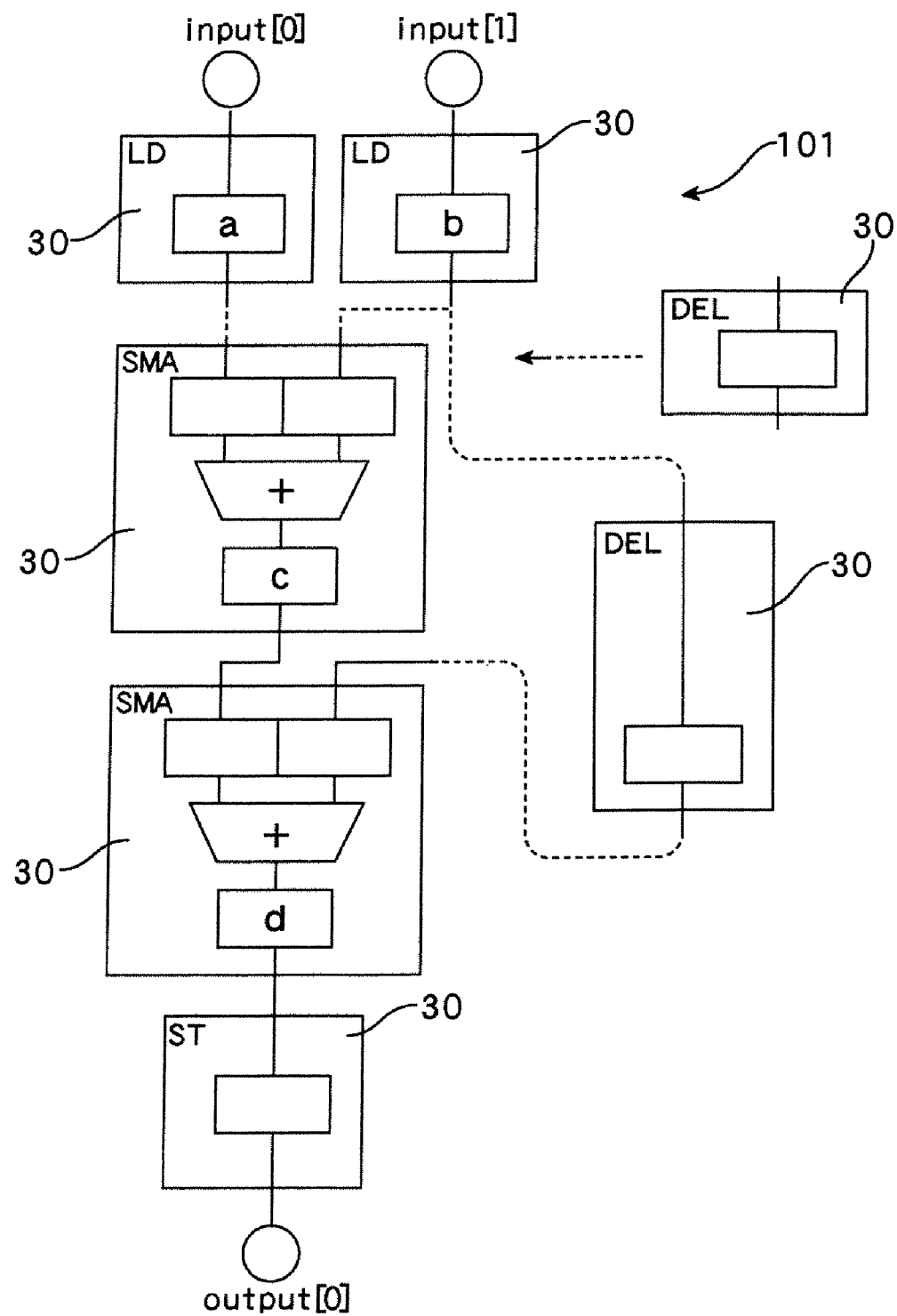
FIG. 19 shows an example where a data flowgram is composed by a configuration of operation units.

The data flowgram 101 shown in FIG. 18 performs two additions of two pieces of input data to obtain output data, and can be replaced with the configuration of operation units 30 shown in FIG. 19. In more detail, starting at the downstream end, this configuration includes an output operation unit ST, two operation units SMA for arithmetic operations, and two input logic units LD. Two clocks are consumed by the addition by the two operation units SMA for arithmetical operations, so that a delay logic unit DEL for adjusting the clocks (latency) is included in the configuration. Also, depending on the layout of the matrix 20, logic units DEL for adjusting the delay need to be included in the configuration as appropriate.

Figure 20:
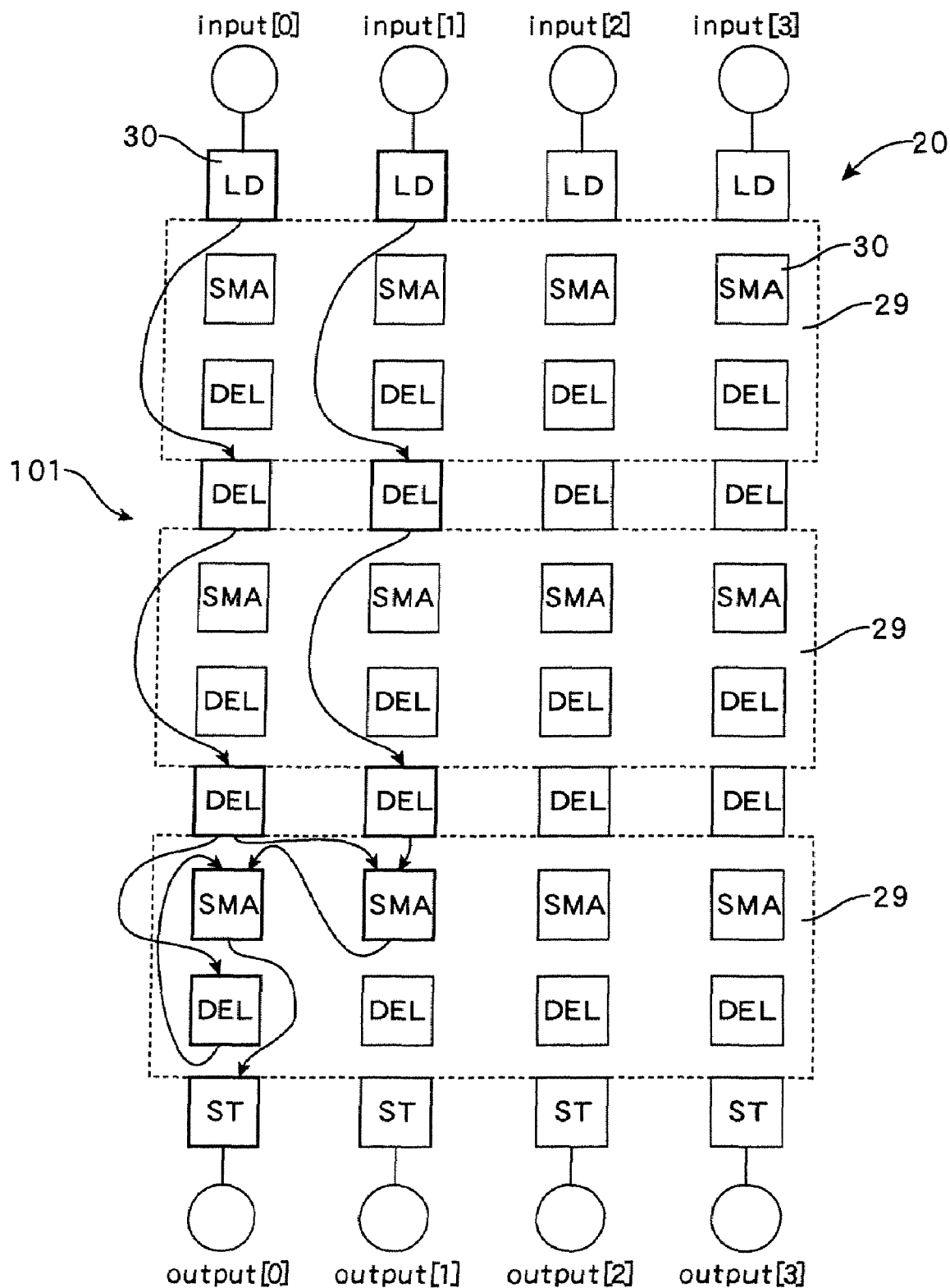
FIG. 20 shows an example where a data flowgram has been mapped onto the matrix.
Figure 21:
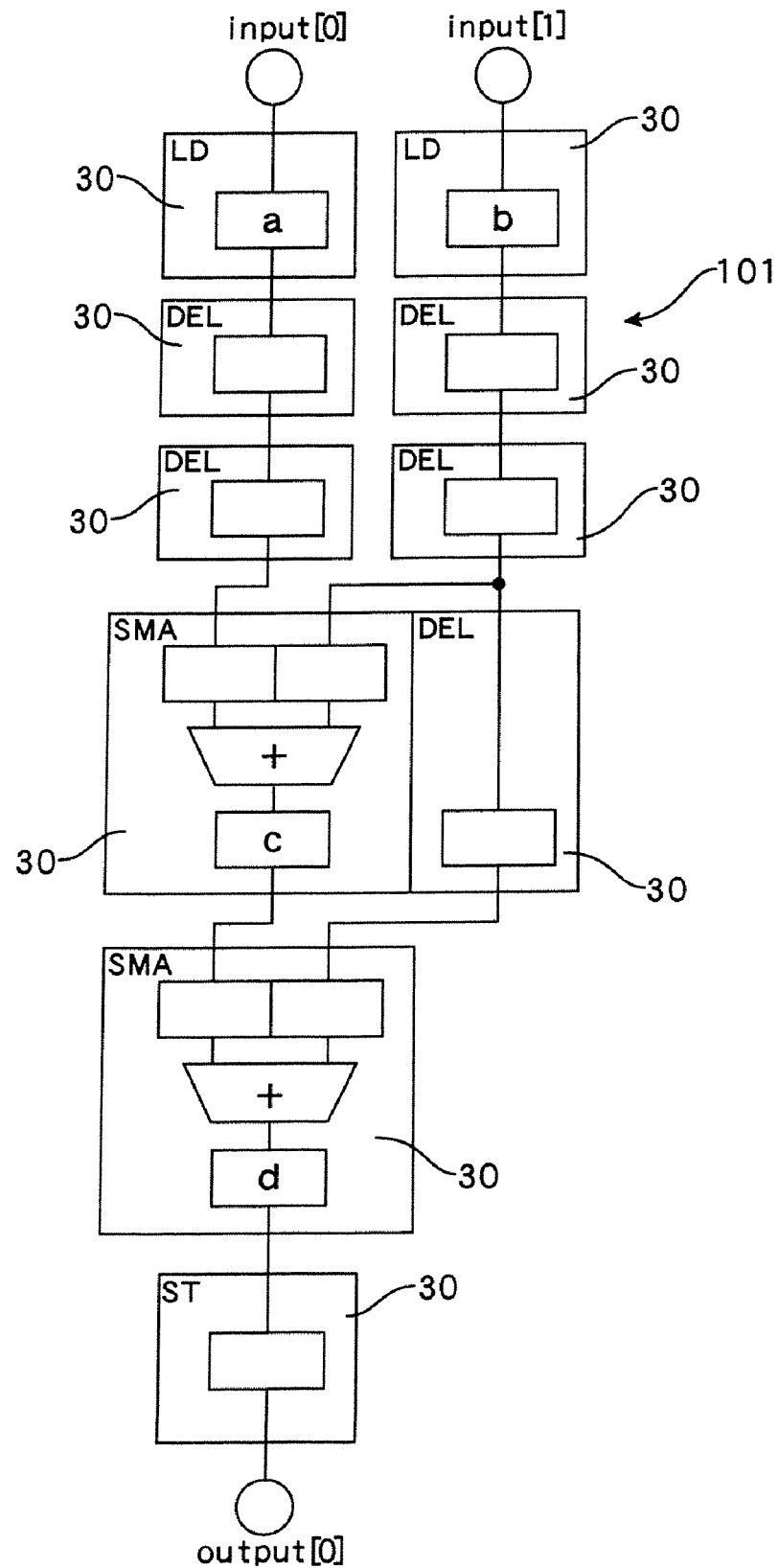
FIG. 21 is an example showing a configuration for realizing a data flowgram in the matrix.

FIG. 20 shows the how the data flowgram 101 is assigned to the matrix 20. The operation unit SMA at the end of the flowgram is found out in the same column as the operation unit ST that outputs the value produced by the operation unit SMA. The operation unit DEL that is the input source of one of the values added by this operation unit SMA is found out in the same column as the operation unit SMA, while the operation unit SMA that is the other input source is found out in an adjacent column. The matrix 20 shown in FIG. 20 is divided into three segments 29, so that the operation unit LD that is the input source for the operation unit DEL in the same column is connected to this operation unit DEL via two other operation units DEL. In the same way, the operation unit LD that is the input source for the operation unit SMA located in the adjacent column is connected to the operation units SMA via two operation units DEL. Accordingly, the actual configuration for the data flowgram 101 that is mapped onto the matrix 20 is as shown in FIG. 21. The instruction or instructions 80 that indicate this configuration are incorporated into the execution program 3 of the LSI 10 that includes this matrix 20, with the RISC processor 11 controlling the configuration of the matrix 20 according to the instructions 80. By doing so, the processing of the intermediate description 73b is executed by hardware in the matrix 20.

As described above, the integrated circuit device of the present invention includes a data processing block (matrix) in which different types of operation units that include data paths suited to special-purpose processing are arranged, and by choosing or defining a configuration or configurations of these various types of operation units, an integrated circuit device that can execute part or all of a provided specification in hardware can be designed and manufactured in an extremely short time. The operation units that are arranged in the data processing block are provided with functions for executing instructions, so that by merely converting the provided specification into a description written in the intermediate language that includes the instructions supported by the operation units, software processing can be converted into hardware processing. Also, the processing that is executed by this data processing block can be defined by merely finding a configuration of operation units. This means that in order to manufacture hardware for executing a provided specification, there is no need to use a hardware description language, to perform a logical synthesis of the configuration at transistor level and then generate the hardware, or to perform a conversion into information that can be loaded into an FPGA. The intermediate language description that is produced in order to generate the configuration of operation units is a programming language that enables the designer to easily grasp the processing and makes it possible for modification or changes to be made with great flexibility and in a short time.

The operation units that are arranged in the data processing block do not all have to have wide applicability with each one having the same construction, and so include different or unique data paths that are suited to the execution of the processing indicated by instructions, resulting in little redundancy in the circuit. This makes it possible to provide a compact, economical integrated circuit device. It is also possible to provide the integrated circuit device with a high processing speed and favorable AC characteristics. In this integrated circuit device, the functioning that is composed or configured by the plurality of the operation units can be changed easily in just one clock, so that the resources including the operation units and wiring groups, that compose the data processing block can be used effectively for various kinds of processing.

The embodiment described above is only one example of the present invention, and as disclosed in this specification, a variety of variations are possible. As one example, the data flowgrams, which are defined of configurations of operation units arranged in a matrix, include everything from data flowgrams that are fixed in the matrix to data flowgrams that can be dynamically reconfigured by a program in the matrix. Control over the configuration of operation units and the selection of data paths in operation units is not limited to indications from a RISC processor, so that indications can be made from another LSI, another matrix, or even from an operation unit within the matrix. The operation units described above are examples including data paths that are suited to special-purpose processing such as arithmetic operations, logic operations, multiplications, delays, etc., though the functions and constructions of the data paths included in the operation units are not limited to these examples. Also, the types of operation units that are arranged in a matrix are not limited to the examples described above. The effects of the present invention can also be obtained by generating various types of operation units including data paths with functions that are suited to the application that is to be executed by the data processing apparatus of the present invention, arranging these operation units, and wiring the operation units with buses.

INDUSTRIAL APPLICABILITY

The integrated circuit device or apparatus of the present invention can be provided as a system LSI that can execute various kinds of data processing. Also, the integrated circuit device of the present invention is not limited to an electronic circuit, and can be adapted to an optical circuit or an optoelectronic circuit. The integrated circuit device of the present invention can execute data processing at high speed using reconfigurable hardware, and can be favorably used as a data processing apparatus that needs to operate at high-speed and in real-time, such as a data processing apparatus for network processing or image processing.

The invention claimed is:

1. An integrated circuit device comprising a data processing block including a first matrix and a second matrix, the first matrix and the second matrix respectively including a plurality of types of operation units and a wiring group for connecting the plurality of types of operation units, a configuration of data flow with the plurality of types of operation units being changeable by changing a route of the wiring group for data supplying to the plurality of types of operation units,
    wherein one of the plurality of types of operation units is a delay type operation unit that include a data path suited to processing for delaying a transfer time of data,
    the wiring group of the first matrix and the wiring group of the second matrix are separated, and
    the integrated circuit device further comprises a plurality of the delay type operation units that are arranged along a boundary of the first matrix and the second matrix for connecting the wiring group of the first matrix and the wiring group of the second matrix via data paths included in the plurality of the delay type operation units.

2. The integrated circuit device according to claim 1, wherein the plurality of types of operation units include different types of operation units that include data paths that are suited to at least one different processing of instruction level.

3. The integrated circuit device according to claim 1, wherein each operation unit includes a flip-flop for latching input data and a flip-flop for latching output data, and the flip-flops are controlled with unit of clock for establishing a number of clocks consumed in the each operation unit.

4. The integrated circuit device according to claim 1, wherein the plurality of types of operation units includes at least one type of operation units that include a path that links another operation units arranged in a same direction and provides an expanded operating function.

5. The integrated circuit device according to claim 1, wherein the plurality of types of operation units include at least one of:
a first type of operation unit including a data path suited to input processing of data;
a second type of operation unit including a data path suited to processing that indicates an address of input data;
a third type of operation unit including a data path suited to output processing of data;
a fourth type of operation unit including a data path suited to processing that indicates an address of data to be outputted;
a fifth type of operation unit including a data path suited to processing for arithmetic operations and/or logic operations;
a sixth type of operation unit including a data path suited to multiplication processing;
a seventh type of operation unit including a data path suited to processing that connects to a computational circuit located on an outside of the data processing block; and
an eighth type of operation unit including a data path whose processing is selected using a lookup table.

6. The integrated circuit device according to claim 1, wherein the plurality of types of operation units are arranged in a first and second direction in a matrix.

7. The integrated circuit device according to claim 6, wherein the wiring group includes:
a plurality of first wire sets that extend in the first direction corresponding to an arrangement of the plurality of types of operation units in the first direction and transfer input data and/or output data of each of the operation units;
a plurality of second wire sets that extend in the second direction corresponding to an arrangement of the plurality of types of operation units in the second direction and transfer input data and/or output data of each of the operation units; and
a plurality of switching units that are arranged at each intersection between the first wire sets and the second wire sets and are capable of selecting and connecting any wire included in the first wire sets to any wire included in the second wire sets,
wherein each of the plurality of types of operation units includes means for selecting any of the wires included in the first wire sets and/or the second wire sets and inputting and/or outputting a signal.

8. The integrated circuit device according to claim 7,
wherein each of the plurality of types of operation unit
includes a rewritable configuration memory that stores a selection of wires, and each of the switching units includes a rewritable configuration memory that stores a selection of wires.

9. The integrated circuit device according to claim 1,
wherein the plurality of types of operation units include at least one type of operation units that include an internal data path that is suited to execution of at least one instruction and means for selecting and/or changing part of the internal data path,
and the configuration memory in the at least one type of operation units stores a selection and/or change of the internal data path.

10. The integrated circuit device according to claim 9,
further comprising a control unit for rewriting a content of the configuration memories based on a program.

11. The integrated circuit device according to claim 1,
further comprising a control unit for controlling a configuration of the plurality of types of operation units based on a program.

12. The integrated circuit device according to claim 11,
wherein the plurality of types of operation unit include at least one type of operation units that include an internal data path that is suited to execution of at least one instruction and means for selecting and/or changing part of the internal data path, and
the control unit also controls a selection and/or change of the internal data path.

13. The integrated circuit device according to claim 12,
wherein the control unit is a general-purpose processor.

14. A method of designing an integrated circuit device that includes a data processing block in which a first matrix and a second matrix are included, the first matrix and the second matrix respectively including a plurality of types of operation units and a wiring group, a configuration of data flow with the plurality of types of operation units being changeable by changing a route of the wiring group, one of the plurality of types of operation units is a delay type operation unit that includes a data path suited to processing for delaying a transfer time of data, the wiring group of the first matrix and the wiring group of the second matrix being separated, a plurality of the delay type operation units being arranged along a boundary of the of the first matrix and the second matrix for connecting the wiring group of the first matrix and the wiring group of the second matrix via data paths included in the plurality of the delay type operation units,
the method comprising the steps of:
generating an execution configuration of a first flow by using place and route process with the plurality of types of operation units and the least one of the plurality of the delay type operation units that connect the wiring group of the first matrix and the wiring group of the second matrix; and
generating an execution program that includes a process using the first data flow, for the integrated circuit device, the execution program including an instruction that indicates the execution configuration of the first data flow.

15. The method according to the claim 14,
wherein the plurality of types of operation units including different types of operation units that include data paths suited to processing for at least one different instruction, and
the method further includes the steps of:
converting at least a part of processing that is executed in the integrated circuit device into an intermediate description written in a programming language that includes instructions that are executed by corresponding types of operation units of the plurality of types of operation units; and
generating the execution configuration that is capable of executing processing of the intermediate description.

16. The method according to claim 15,
wherein at least one type of operation units of the plurality of types of operation units include an internal data path that is suited to processing of at least one instruction and means for selecting and/or changing part of the internal data path, and
the method further includes the step of generating the execution configuration that includes a selection and/or change of the internal data path.

* * * * *